US012690281B2

(12) United States Patent (10) Patent No.: US 12,690,281 B2
Jang (45) Date of Patent: Jul. 21, 2026

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 431 days.

(21) Appl. No.: 18/489,701

(22) Filed: Oct. 18, 2023

(65) Prior Publication Data

US 2024/0145523 A1 May 2, 2024

(30) Foreign Application Priority Data

Oct. 28, 2022 (KR) ......................... 10-2022-0141086

(51) Int. Cl.
*H10F 39/15* (2025.01)
(52) U.S. Cl.
CPC ......... *H10F 39/151* (2025.01); *H10F 39/153* (2025.01)
(58) Field of Classification Search
CPC ...... H10F 39/151; H10F 39/153; H10F 39/12; H10F 39/18; H10F 39/802; H10F 39/8033; H10F 39/807; H10F 39/8023; H10F 39/8037; H04N 25/706
See application file for complete search history.

(56) References Cited

U.S. PATENT DOCUMENTS

2021/0364604 A1 11/2021 Isogai et al.
2021/0368122 A1* 11/2021 Jang ........................ H10F 39/18
2022/0068983 A1 3/2022 Yamazaki

FOREIGN PATENT DOCUMENTS

KR 20210145390 A 12/2021
KR 20220072257 A 6/2022

OTHER PUBLICATIONS

Request for the Submission of an Opinion for KR Appl. No. 10-2022-0141086, mailed on Mar. 25, 2026, 16 pages with English translation.

* cited by examiner

*Primary Examiner* — Xi Wang
(74) *Attorney, Agent, or Firm* — Perkins Coie LLP

(57) ABSTRACT
An image sensing device includes a first detection structure and a second detection structure, each of the first detection structure and the second detection structure configured to generate a current in a substrate and to capture photocharges generated by incident light and carried by the current, wherein each of the first detection structure and the second detection structure includes: at least one detection node configured to capture the photocharges, the at least one detection node including first conductive impurities; and a potential adjustment region overlapping at least a portion of each of the at least one detection node, the potential adjustment region including second conductive impurities different from the first conductive impurities.

20 Claims, 18 Drawing Sheets

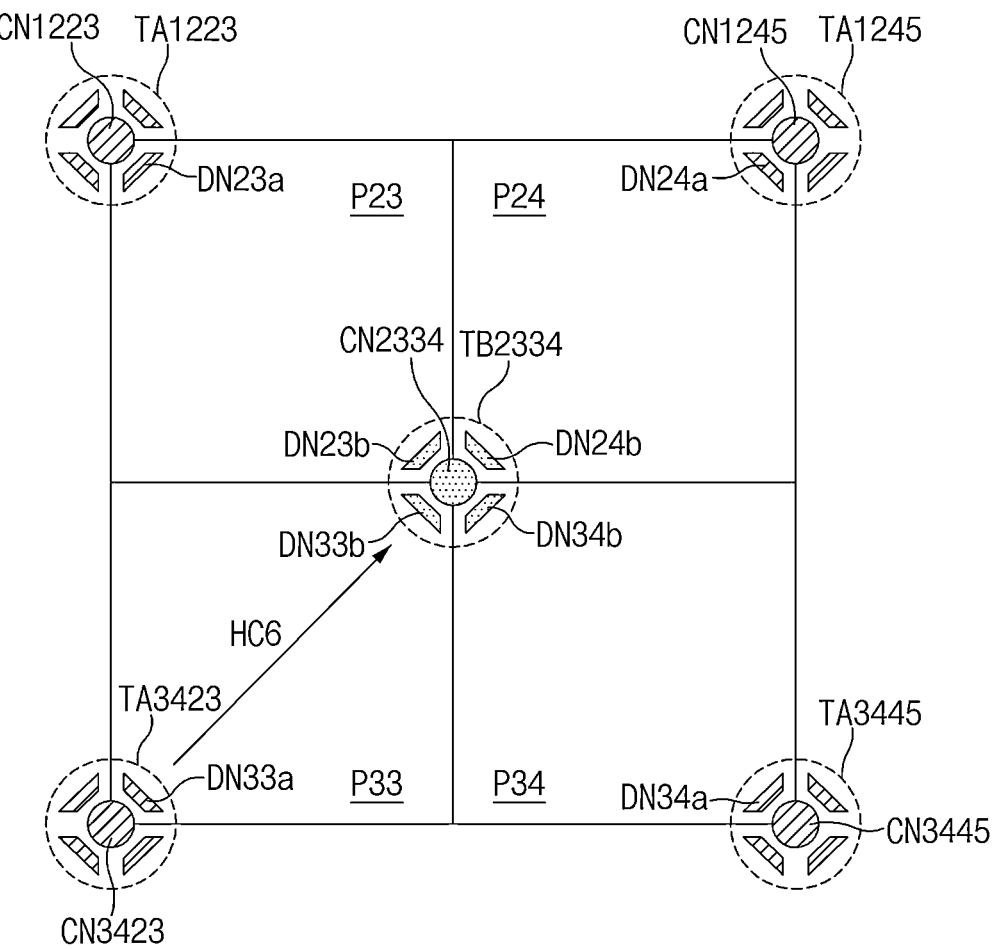
F I G .10

1300

1500

1600

IMAGE SENSING DEVICE

CROSS-REFERENCE TO RELATED APPLICATION

This patent document claims the priority and benefits of Korean patent application No. 10-2022-0141086, filed on Oct. 28, 2022, the disclosure of which is incorporated herein by reference in its entirety as part of the disclosure of this patent document.

TECHNICAL FIELD

The technology and implementations disclosed in this patent document generally relate to an image sensing device for sensing a distance to a target object.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

There have been much developments and studies for measuring range and depth (i.e., a distance to a target object) using image sensors. For example, demand for the technologies of measuring range and depth using image sensors have been rapidly increasing in various devices, for example, security devices, medical devices, automobiles, game consoles, virtual reality (VR)/augmented reality (AR) devices, mobile devices, etc. Methods for measuring depth information using one or more image sensors are mainly classified into a triangulation method, a Time of Flight (TOF) method, and an interferometry method. Among above-mentioned depth measurement methods, the Time of Flight (TOF) method becomes popular because of its wide range of utilization, high processing speed, and cost advantages. The TOF method measures a distance using emitted light and reflected light, such that the TOF method has a higher degree of importance. The TOF method may be mainly classified into two different types, i.e., a direct method and an indirect method, depending on whether it is a round-trip time or the phase difference that determines the distance. The direct method may calculate a round trip time using emitted light and reflected light and measure the distance (i.e., depth) to the target object using the calculated round trip time. The indirect method may measure the distance to the target object using a phase difference. The direct method is suitable for measuring a long-distance measurement and thus is widely used in automobiles. The indirect method is suitable for measuring a short-distance measurement and thus is widely used in various higher-speed devices designed to operate at a higher speed, for example, game consoles, mobile cameras, or others. As compared to the direct type TOF systems, the indirect method have several advantages, including having simpler circuitry, low memory requirement, and a relatively low cost.

A Current-Assisted Photonic Demodulator (CAPD) method serving as any one of pixel types corresponding to indirect TOF sensors is a method for detecting electrons that have been generated in pixels using a majority current acquired by applying a voltage to a substrate, using a difference in potential between electric fields. In this way, since the CAPD method is designed to use the majority current, the CAPD method can more quickly detect electrons and can detect some electrons formed at a deep depth, such that the CAPD method has superior efficiency.

SUMMARY

Various embodiments of the disclosed technology relate to an image sensing device provided with pixels optimized in structure for miniaturization.

In one aspect, an image sensing device is provided to comprise: a first detection structure and a second detection structure, each of the first detection structure and the second detection structure configured to generate a current in a substrate and to capture photocharges generated by incident light and carried by the current, wherein each of the first detection structure and the second detection structure includes: at least one detection node configured to capture the photocharges, the at least one detection node including first conductive impurities; and a potential adjustment region overlapping at least a portion of each of the at least one detection node, the potential adjustment region including second conductive impurities different from the first conductive impurities.

In another aspect, an image sensing device is provided to comprise: a first detection structure and a second detection structure, each of which is configured to generate a current in a substrate and to capture photocharges generated by incident light and carried by the current, wherein each of the first detection structure and the second detection structure includes: a first doped region that captures the photocharges and includes first conductive impurities; and a potential adjustment region that is in contact with at least a portion of the first doped region and includes second conductive impurities having a conductivity type different from that of the first conductive impurities.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIGS. 7 to 10 are schematic diagrams illustrating examples of operations of an image sensing device operating in a second mode based on some implementations of the disclosed technology.

DETAILED DESCRIPTION

Figure 1:
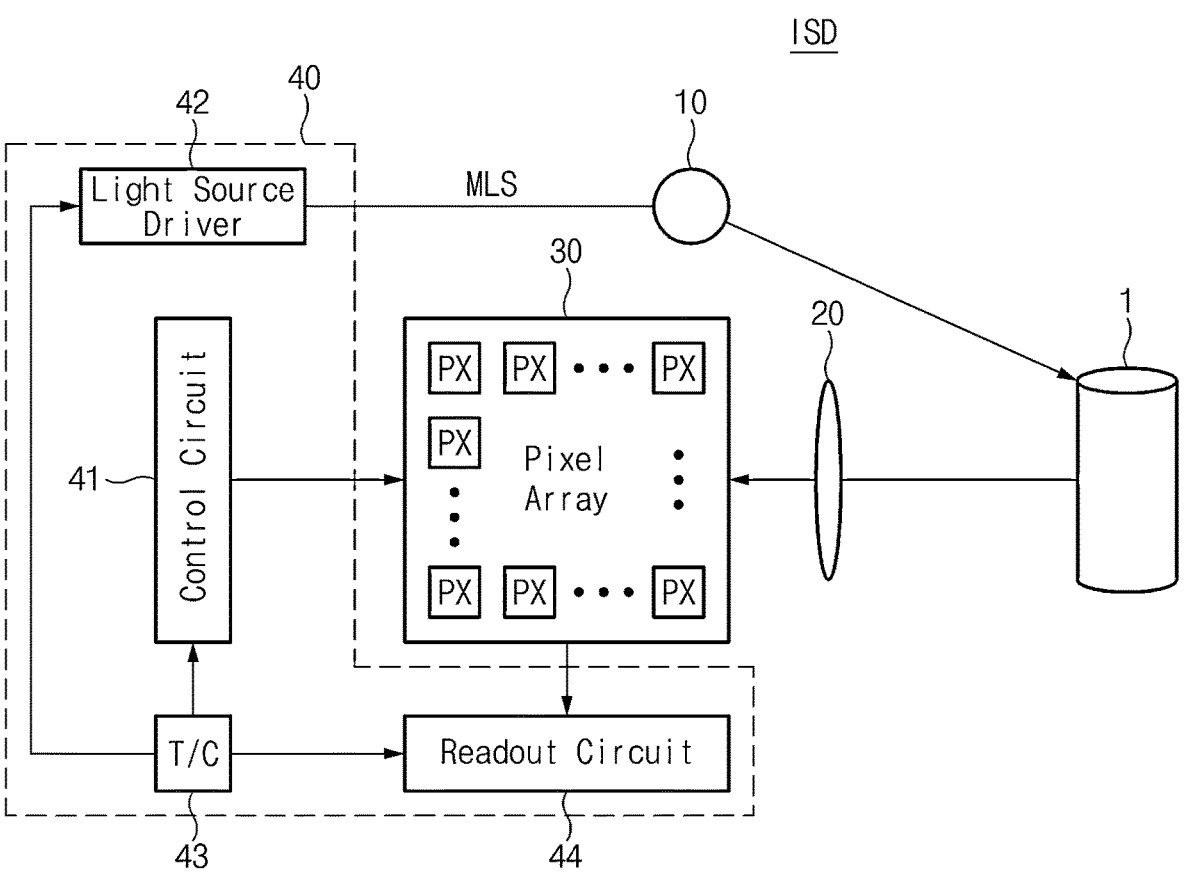
FIG. 1 is a block diagram illustrating an example of an image sensing device based on some implementations of the disclosed technology.

This patent document provides implementations and examples of an image sensing device for sensing a distance to a target object that may be used in configurations to substantially address one or more technical or engineering issues and to mitigate limitations or disadvantages encountered in some other image sensing devices. Some implementations of the disclosed technology relate to an image sensing device provided with pixels optimized in structure for miniaturization. The disclosed technology provides various implementations of an image sensing device which includes a detection node having a first conductivity type and including a doped region of a second conductivity type opposite to the first conductivity type. With the doped region of the second conductivity type, it is possible to reduce generation of noise caused by unintended or undesired photocharge collection.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

FIG. 1 is a block diagram illustrating an example of an image sensing device ISD based on some implementations of the disclosed technology.

Referring to FIG. 1, the image sensing device ISD may measure the distance to a target object 1 using the Time of Flight (TOF) principle. The image sensing device ISD may include a light source 10, a lens module 20, a pixel array 30, and a control block 40.

The light source 10 may emit light to a target object 1 upon receiving a modulated light signal (MLS) from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared (NIR) Laser, a point light source, a monochromatic light source combined with a white lamp or a monochromator, and a combination of other laser sources. For example, the light source 10 may emit infrared light having a wavelength of 800 nm to 1000 nm. Light emitted from the light source 10 may be light (i.e., modulated light) modulated by a predetermined frequency. Although FIG. 1 shows only one light source 10 for convenience of description, other implementations are also possible. For example, a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) matrix structure in which unit pixels are arranged in a column direction and a row direction perpendicular to the column direction. The unit pixels (PXs) may be formed over a semiconductor substrate. Each unit pixel (PX) may convert incident light received through the lens module 20 into an electrical signal corresponding to the amount of incident light, and may thus output a pixel signal using the electrical signal. In this case, the pixel signal may be a signal indicating the distance to the target object 1 rather than a signal indicating a color of the target object 1. Each unit pixel (PX) may be a Current-Assisted Photonic Demodulator (CAPD) pixel. The structure and operations of each unit pixel (PX) will hereinafter be described with reference to FIG. 2 and more figures.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a control circuit 41, a light source driver 42, a timing controller (T/C) 43, and a readout circuit 44.

The control circuit 41 may drive unit pixels (PXs) of the pixel array in response to a timing signal generated from the timing controller 43. For example, the control circuit 41 may generate a control signal capable of selecting and controlling at least one row line from among the plurality of row lines. The control signal may include a demodulation control signal for generating a charge current (e.g., a hole current) in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor, and the like. Although FIG. 1 illustrates the control circuit 41 arranged in a column direction (i.e., a vertical direction) of the pixel array 30 for convenience of description, at least some parts (e.g., a circuit for generating a demodulation control signal) of the control circuit 41 may be arranged in a row direction (i.e., a horizontal direction) of the pixel array 30.

The light source driver 42 may generate a light modulation signal MLS capable of driving the light source 10 in response to a control signal from the timing controller 43. The light modulation signal MLS may be a signal that is modulated by a predetermined frequency.

The timing controller 43 may generate a timing signal to control the control circuit 41, the light source driver 42, and the readout circuit 44.

The readout circuit 44 may process pixel signals received from the pixel array 30 under control of the timing controller 43, and may thus generate pixel data formed in a digital signal shape. To this end, the readout circuit 44 may include a correlated double sampler (CDS) circuit for performing correlated double sampling (CDS) on the pixel signals generated from the pixel array 30. In addition, the readout circuit 44 may include an analog-to-digital converter (ADC) for converting output signals of the CDS circuit into digital signals. In addition, the readout circuit 44 may include a buffer circuit that temporarily stores pixel data generated from the analog-to-digital converter (ADC) and outputs the pixel data under control of the timing controller 43. In the meantime, since the pixel array 30 includes CAPD pixels, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX). A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image including depth information for each unit pixel (PX).

Figure 2:
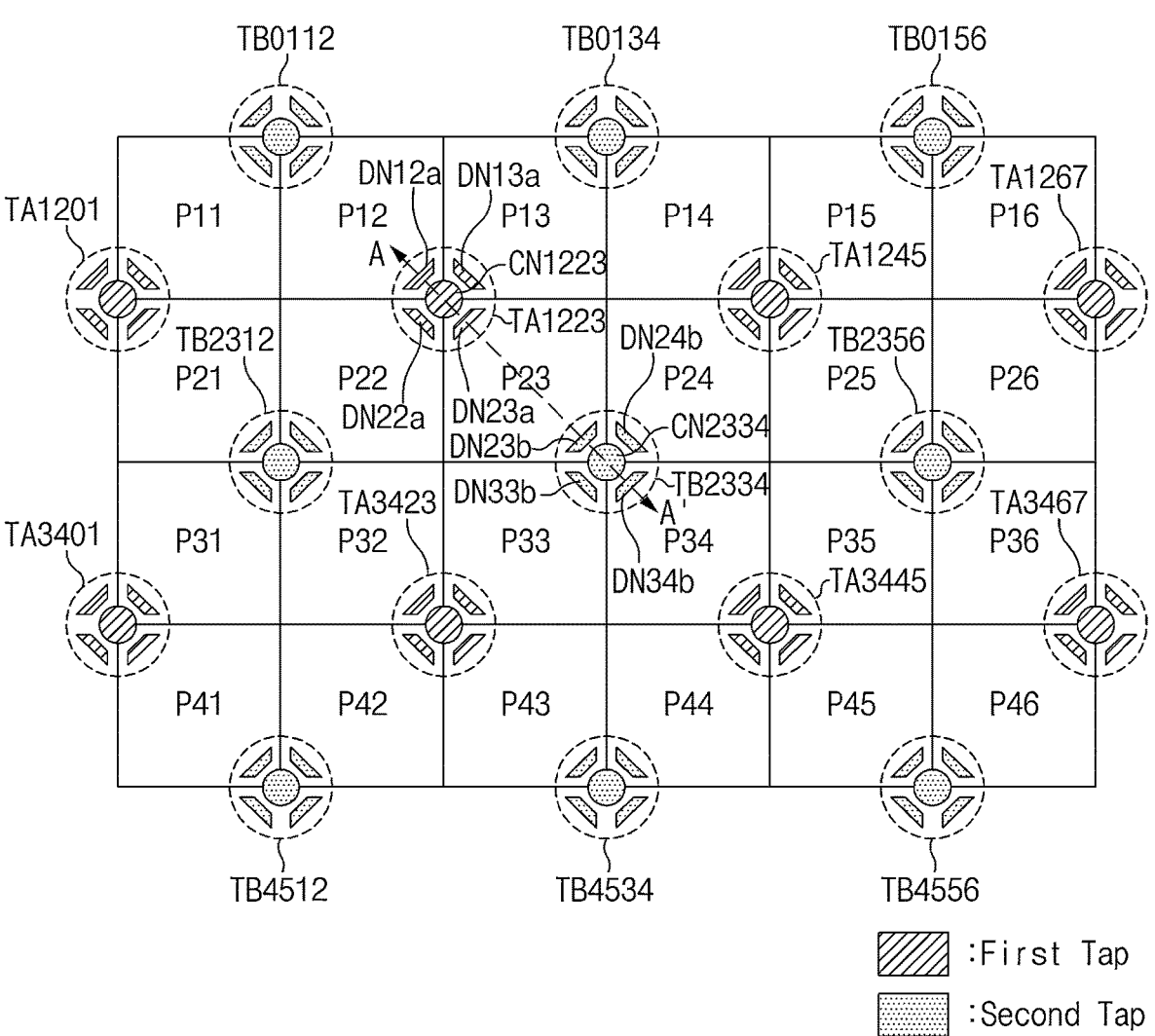
FIG. 2 is a schematic diagram illustrating an example of a pixel array shown in FIG. 1 based on some implementations of the disclosed technology.

FIG. 2 is a schematic diagram illustrating an example of the pixel array 30 shown in FIG. 1 based on some implementations of the disclosed technology.

Referring to FIG. 2, one example of the pixel array 30 is illustrated. Although FIG. 2 exemplarily illustrates 24 pixels arranged in a matrix shape including four rows and six columns, other implementations are also possible. Thus, the pixel array 30 can also include an arbitrary number of sub-pixels as necessary.

Each pixel may be referred to as Pnm (where 'n' indicates a row including the corresponding pixel, and 'm' indicates a column including the corresponding pixel). For example, the pixel P23 may belong to a second row and a third column. A number, '0,' is used to refer to each of a row disposed at an upper side of the first row and a column disposed at a left side of the first column. In addition, a number, '5,' is used to refer to a row disposed at a lower side of the fourth row and a number, '7,' is used to refer to a column disposed at a right side of the sixth column.

The pixel array 30 includes detection structures for collecting and detecting photocharge produced by the pixels. Each detection structure is referred to as a tap and includes a control node configured to receive a control signal and a detection node disposed adjacent to the control node to collect and detect photocharge generated by the pixels in response to incident light. In the example in FIG. 2, the pixel array 30 may include first taps (e.g., TA1201) and second taps (e.g., TB0112) that are regularly arranged in the pixel array 30.

Each of the first taps may be disposed at the center of four pixels arranged in an arbitrary (2×2) matrix, and each of the second taps may be disposed at the center of four pixels arranged in an arbitrary (2×2) matrix. For example, the first tap TA1223 may be disposed at the center of the pixels P12, P13, P22, and P23, and the second tap TB2334 may be disposed at the center of the pixels P23, P24, P33, and P34. The first tap or the second tap may be referred to as Txy, where 'x' indicates the type of a tap (e.g., the first tap is denoted by 'A' or the second tap is denoted by 'B') and 'y' indicates the position of a tap. For example, the tap denoted by TA1223 is arranged at center of pixels P12, P13, P22, and P23 corresponding to an intersection of pixels belonging to the first row and the second row and other pixels belonging to the second column and the third column). In some implementations, when a certain structure is disposed at the center of four pixels, the center of the corresponding structure (e.g., the first tap) is identical to the center of the four pixels. In some other implementations, when a certain structure is disposed at the center of four pixels, a portion of the corresponding structure overlaps with the center of the four pixels.

For convenience of description and better understanding of the disclosed technology, the upper-left vertex region of each pixel will hereinafter be referred to as a first vertex region, the upper-right vertex region of each pixel will hereinafter be referred to as a second vertex region, the lower-left vertex region of each pixel will hereinafter be referred to as a third vertex region, and the lower-right vertex region of each pixel will hereinafter be referred to as a fourth vertex region. In some implementations, the expression "vertex region" may mean a region including each vertex of a pixel.

A first tap and a second tap may be respectively disposed in two vertex regions (e.g., the first and fourth vertex regions, or the second and third vertex regions) that face each other in a diagonal direction in each pixel. Here, a diagonal direction from the first vertex region to the fourth vertex region will hereinafter be referred to as a first diagonal direction, and a diagonal direction from the second vertex region to the third vertex region will hereinafter be referred to as a second diagonal direction. Assuming that a first tap and a second tap are disposed in a first diagonal direction in a particular pixel, the first tap and the second tap can be arranged in a second diagonal direction in pixels adjacent to the particular pixel, which are located at upper, lower, left, and right sides of the particular pixel.

The first taps and the second taps may be alternately disposed in the first diagonal direction or the second diagonal direction within the pixel array 330. For example, the second tap TB2334, the first tap TA3445, and the second tap TB4556 may be alternately disposed in a first diagonal direction with respect to the first tap TA1223.

In some implementations, the first taps or the second taps may be sparsely disposed in a row direction (or a horizontal direction) or a column direction (or a vertical direction) of the pixel array 30 without being respectively disposed at consecutive vertex regions. For example, a vertex region where the first tap or the second tap is disposed in the row direction (or horizontal direction) or the column direction (or vertical direction) and a vertex region where the first tap or the second tap is not disposed in the row or column direction may be alternately arranged.

Each of the first tap and the second tap may include a control node and a plurality of detection nodes disposed on sides of the control node to surround the control node. The detection nodes are disposed to be spaced from the control node and configured to have a shape that surrounds the control node. Although each of the control nodes shown in FIG. 2 is formed in a circular shape and each of the detection nodes shown in FIG. 2 is formed in a trapezoidal shape, those shapes of the control nodes and the detection nodes are examples only and other implementations are also possible. Each of the detection nodes shown in FIG. 2 may be formed in a trapezoidal shape. In more detail, the detection node may be formed in a trapezoidal shape in which one side contiguous or adjacent to the control node surrounded by the detection node is shorter in length than the other side arranged to face the one side. Such trapezoidal shape of the detection nodes may help each of the detection nodes in a tap to surround areas of the control node in the tap as large as possible. The trapezoidal shape of the detection nodes allows to more easily capture signal carriers which migrate along a charge current (e.g., a hole current) caused by each of the control nodes.

The control node may be disposed at the center (or at the vertex region(s) of each pixel) of four pixels constructing a (2×2) matrix array. The detection nodes may be arranged to face each other in a first or second diagonal direction with respect to the control node. In addition, each of the detection nodes may be partially included in four pixels contiguous or adjacent to each of the control nodes. For example, the control node CN2334 of the second tap TB2334 may be disposed at the center of the pixels P23, P24, P33, and P34, and the detection nodes DN23*b*, DN24*b*, DN33*b*, and DN34*b* may be respectively included in the pixels P23, P24, P33, and P34.

A hole current flowing between the control nodes receiving different voltages may increase in proportion to a potential difference between the control nodes, may increase in inverse proportion to the distance between the control nodes, and may increase in proportion to the size of the region of each of the facing sides of the control nodes. In contrast, a hole current flowing between the control nodes receiving different voltages may decrease in inverse proportion to a potential difference between the control nodes, may decrease in proportion to the distance between the control nodes, and may decrease in inverse proportion to the size of the region of each of the facing sides of the control nodes. In other words, a hole current may be determined by a potential difference between the control nodes and resistance between the control nodes. The resistance between the control nodes may increase in proportion to the distance between the control nodes, and may also increase in inverse proportion to the size of the region of the facing sides of the control nodes.

Pixels arranged in a (2×2) matrix may share a control node, and each pixel may independently include a detection node. As the pixels arranged in the (2×2) matrix share the control node without independently including the control node, the distance between the control nodes within any pixel can maximally increase, resulting in reduction in the magnitude of hole current.

In addition, as the pixels arranged in the (2×2) matrix share the control node, the number of control nodes required in the pixel array 30 is reduced to ¼ as compared to the case where each pixel includes its own control node. By sharing the control nodes in the adjacent pixels, load to which a voltage needs to be applied by the control circuit 41 can be greatly reduced, so that power consumption of the image sensing device can be greatly reduced.

In some implementations, a control node and at least one detection node included in the first tap will hereinafter be referred to as a first detection node and at least one first detection node, and a control node and at least one detection node included in the second tap will hereinafter be referred to as a second detection node and at least one second detection node.

Figure 3:
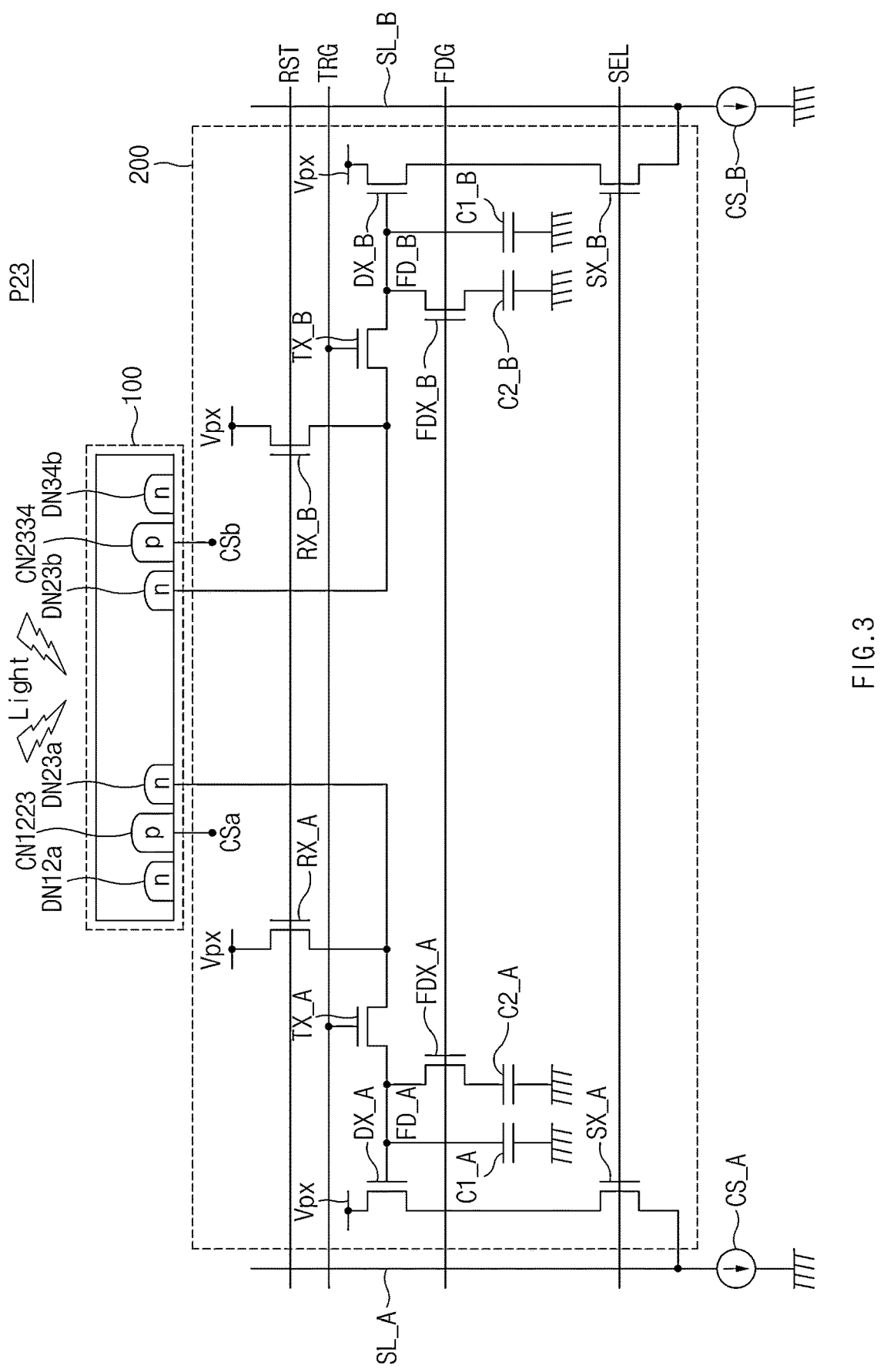
FIG. 3 is a circuit diagram illustrating an example of a pixel included in the pixel array shown in FIG. 2 based on some implementations of the disclosed technology.

FIG. 3 is a cross-sectional view of the pixel array 30 taken along a straight line A-A' shown in FIG. 2, and the structure and operation of each pixel included in the pixel array 30 will hereinafter be described with reference to FIG. 3.

FIG. 3 is a circuit diagram illustrating an example of a pixel included in the pixel array shown in FIG. 2.

Referring to FIG. 3, a pixel P23 may include a photoelectric conversion region 100 and a circuit region 200. Although the pixel P23 is described as an example in FIG. 3, other pixels included in the pixel array 30 may have substantially the same structure as the pixel P23 and operate in the similar manner.

The photoelectric conversion region 100 may correspond to a region illustrating a cross section of the pixel array 30 taken along the straight line A-A' shown in FIG. 2.

The photoelectric conversion region 100 may include first and second control nodes CN1223 and CN2334 and first and second detection nodes DN12a, DN23a, DN23b, and DN34b. The first control node CN1223 and the first detection nodes DN12a and DN23a may be included in a first tap (or a first demodulation node), and the second control node CN2334 and the second detection nodes DN23b and DN34b may be included in a second tap (or a second demodulation node). Since the first detection node DN12a and the second detection node DN34b are not directly related to the operation of the pixel P23, detailed descriptions thereof will herein be omitted for brevity.

In addition, a more detailed structure of the first and second control nodes CN1223 and CN2334 and the first and second detection nodes DN12a, DN23a, DN23b, and DN34b will be described later with reference to FIG. 12A and other figures.

The first and second control nodes CN1223 and CN2334 and the first and second detection nodes DN23a and DN23b may be formed in the substrate. The doping type arrangement for the different regions of a pixel dictates whether the charge current is a hole current or an electron current. In the example in the description below, the charge current is a hole current. For example, when the substrate is a P-type semiconductor substrate, each of the first and second control nodes CN1223 and CN2334 may be formed of or include a P-type impurity region, and each of the first and second detection nodes DN23a and DN23b may be formed of or include an N-type impurity region.

In some implementations, the first and second control nodes CN1223 and CN2334 may include P-type impurity regions having different doping concentrations. For example, the P-type impurity region (e.g., $P^-$ region) having a relatively low doping concentration may be implanted into the substrate to a first depth, and the P-type impurity region (e.g., $P^+$ region) having a relatively high doping concentration may be implanted into the substrate to a second depth at the same position as the above $P^-$-type impurity implantation position. In this case, the first depth may be greater than the second depth. The first and second detection nodes DN23a and DN23b may include N-type impurity regions having different doping concentrations. For example, the N-type impurity region (i.e., $N^-$ region) having a relatively low doping concentration may be implanted into the substrate to a third depth, and the N-type impurity region (i.e., $N^+$ region) having a relatively high doping concentration may be implanted into the substrate to a fourth depth at the same position as the above $N^-$-type impurity implantation position. In addition, the first depth may be greater than the third depth.

The first and second control nodes CN1223 and CN2334 and the first and second detection nodes DN23a and DN23b may be physically separated from each other.

The first control node CN1223 may receive a first demodulation control signal CSa from the control circuit 41, and the second control node CN2334 may receive a second demodulation control signal CSb from the control circuit 41. A potential difference between the first demodulation control signal CSa and the second demodulation control signal CSb may generate an electric field (or a hole current) that controls flow of signal carriers generated in the substrate by incident light.

Each of the first and second detection nodes DN23a and DN23b may capture and accumulate signal carriers.

The circuit region 310 may include a plurality of elements for processing photocharges captured by the first and second detection nodes DN23a and DN23b and converting the photocharges into an electrical signal. Control signals RST, TRG, FDG, and SEL applied to the plurality of elements may be supplied from the control circuit 41. In addition, a pixel voltage (Vpx) may be a power-supply voltage (VDD) or a source voltage (VSS).

Elements for processing photocharges captured by the first detection node DN23a will hereinafter be described with reference to the attached drawings. The circuit region 310 may include a reset transistor RX_A, a transfer transistor TX_A, a first capacitor C1_A, a second capacitor C2_A, a floating diffusion (FD) transistor FDX_A, a drive transistor DX_A, and a selection transistor SX_A.

The reset transistor RX_A may be activated to enter an active state in response to a logic high level of the reset signal RST supplied to a gate electrode thereof, such that potential of the floating diffusion (FD) node FD_A and potential of the first detection node DN23a may be reset to a predetermined level (e.g., the pixel voltage Vpx). In addition, when the reset transistor RX_A is activated (i.e., active state), the transfer transistor TX_A can also be activated (i.e., active state) to reset the floating diffusion (FD) node FD_A.

The transfer transistor TX_A may be activated (i.e., active state) in response to a logic high level of the transfer signal TRG supplied to a gate electrode thereof, such that photocharges accumulated in the first detection node DN23a can be transmitted to the floating diffusion (FD) node FD_A.

The first capacitor C1_A may be coupled to the floating diffusion (FD) node FD_A, such that the first capacitor C1_A can provide predefined electrostatic capacity.

The second capacitor C2_A may be selectively coupled to the floating diffusion (FD) node FD_A according to operations of the floating diffusion (FD) transistor FDX_A, such that the second capacitor C2_A can provide additional predefined electrostatic capacity.

Each of the first capacitor C1_A and the second capacitor C2_A may include, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion (FD) transistor FDX_A may be activated (i.e., active state) in response to a logic high level of the floating diffusion (FD) signal FDG supplied to a gate electrode thereof, such that the floating diffusion (FD) transistor FDX_A may couple the second capacitor C2_A to the floating diffusion (FD) node FD_A.

For example, when the amount of incident light is sufficient to correspond to a relatively high illuminance condition, the control circuit 41 may activate the floating diffusion (FD) transistor FDX_A, such that the floating diffusion (FD) transistor FDX_A enters the active state and the floating diffusion (FD) node FD_A can be coupled to the second capacitor C2_A. As a result, when the amount of incident light is sufficient and thus corresponds to a high illuminance level, the floating diffusion node FD_A can accumulate much more photocharges therein, which makes it possible to guarantee a high dynamic range.

On the other hand, when the amount of incident light is not sufficient and thus corresponds to a relatively low illuminance level, the control circuit 41 may control the floating diffusion (FD) transistor FDX_A to be deactivated (i.e., inactive state), such that the floating diffusion (FD) node FD_A can be isolated from the second capacitor C2_A.

In some other implementations, the floating diffusion (FD) transistor FDX_A and the second capacitor C2_A may be omitted as necessary.

A drain electrode of the drive transistor DX_A is coupled to the pixel voltage (Vpx) and a source electrode of the drive transistor DX_A is coupled to a vertical signal line SL_A through the selection transistor SX_A, such that a load (MOS) and a source follower circuit of a constant current source circuit CS_A coupled to one end of the vertical signal line SL_A can be constructed. Thus, the drive transistor DX_A may output a current corresponding to potential of the floating diffusion node FD_A coupled to a gate electrode to the vertical signal line SL_A through the selection transistor SX_A.

The selection transistor SX_A may be activated (i.e., active state) in response to a logic high level of the selection signal SEL supplied to a gate electrode thereof, such that the pixel signal generated from the drive transistor DX_A can be output to the vertical signal line SL_A.

In order to process photocharges captured by the second detection node DN23b, the circuit region 200 may include a reset transistor RX_B, a transfer transistor TX_B, a first capacitor C1_B, a second capacitor C2_B, a floating diffusion (FD) transistor FDX_B, a drive transistor DX_B, and a selection transistor SX_B. Whereas the elements for processing photocharges captured by the second detection node DN23b may operate at different timing points from those of other elements for processing photocharges captured by the first detection node DN23a, the elements for processing photocharges captured by the second detection node DN23b may be substantially identical in terms of structures and operations to the other elements for processing photocharges captured by the first detection node DN23a. Thus, detailed descriptions of the structures and operations will herein be omitted.

The pixel signal transferred from the circuit region 200 to the vertical signal lines SL_A and the pixel signal transferred from the circuit region 200 to the vertical signal line SL_B may be performed by noise cancellation and analog-to-digital (ADC) conversion processing, such that each of the pixel signals can be converted into image data.

Although each of the reset signal RST, the transmission signal TRG, the floating diffusion (FD) signal FDG, and the selection signal SEL shown in FIG. 3 is denoted by a single signal line, each of the reset signal RST, the transmission signal TRG, the floating diffusion (FD) signal FDG, and the selection signal SEL can be supplied through a plurality of signal lines (e.g., two signal lines). In this case, elements for processing photocharges captured by the first detection node DN23a and the other elements for processing photocharges captured by the second detection node DN23b can operate at different timing points based on signals supplied through the plurality of signal lines (e.g., two signal lines).

The image processor (not shown) may calculate first image data acquired from photocharges captured by the first detection node DN23a and second image data acquired from photocharges captured by the second detection node DN23b, may calculate a phase difference using the first and second image data, may calculate depth information indicating the distance to the target object 1 based on a phase difference corresponding to each pixel, and may generate a depth image including depth information corresponding to each pixel.

Figure 4:
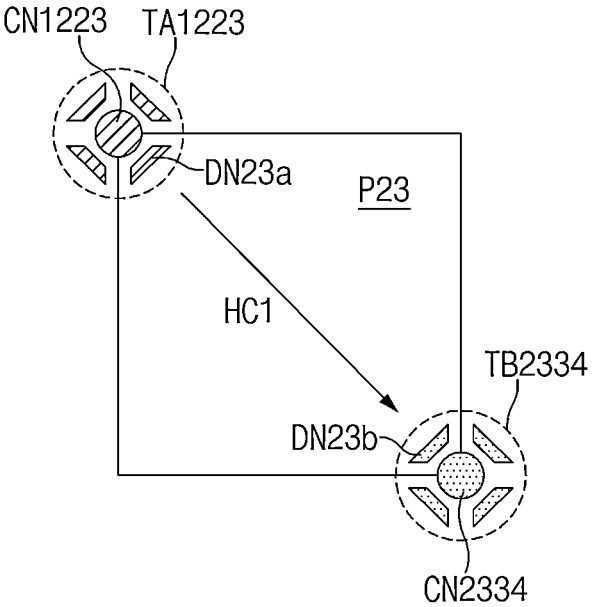
FIGS. 4 and 5 are diagrams illustrating an example of operations of an image sensing device operating in a first mode based on some implementations of the disclosed technology.
Figure 5:
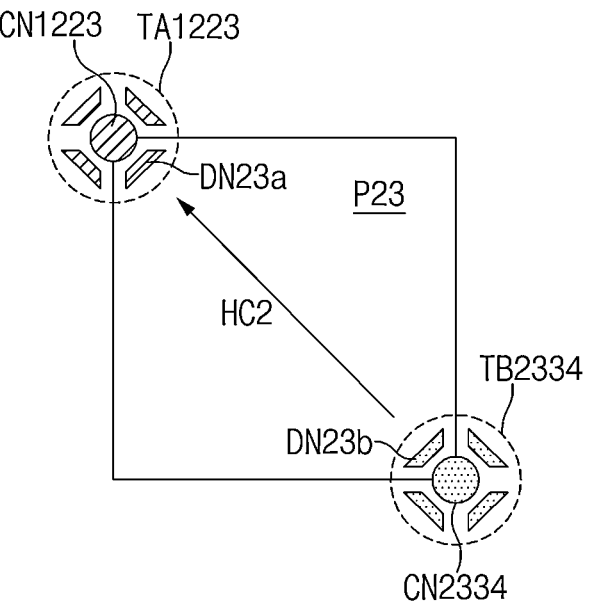

FIGS. 4 and 5 are diagrams illustrating operations of the image sensing device ISD operating in a first mode based on some implementations of the disclosed technology.

Referring to FIG. 4, the image sensing device ISD may operate in two operation modes, i.e., a first mode and a second mode.

The first mode may refer to a mode in which the image sensing device ISD performs photocharge capture of the photoelectric conversion region 100 by dividing the operation period into a first period and a second period. On the other hand, the second mode may refer to a mode in which the image sensing device ISD divides the operation period into the first to fourth periods and captures photocharges in each of the first to fourth periods. The first mode may refer to a 2-phase modulation scheme, and the second mode may refer to a 4-phase modulation scheme.

A detailed operation of the image sensing device ISD operating in the first mode will be given with reference to FIGS. 4 to 6B, and a detailed operation of the image sensing device ISD operating in the second mode will be given with reference to FIGS. 7 to 11B. Although a pixel 23 or the pixel group including the pixel P23 will be described as an example with reference to the attached drawings, substantially the same description as given above can also be applied to other pixels belonging to the pixel array 30.

On the other hand, the image sensing device ISD may be set to operate in any one of the first mode and the second mode as a default. In some other implementations, an image processor (not shown) for controlling the image sensing device ISD may determine an operation mode of the image sensing device ISD according to a user request or a system request, and may transmit a signal corresponding to the determined operation mode to the timing controller 43, so that the image sensing device ISD can operate in the corresponding operation mode.

In the first mode, the operation of capturing photocharges of the photoelectric conversion region 100 may be performed over a first period and a second period following the first period.

In the first period, light incident upon the pixel P23 may be processed by photoelectric conversion, such that a pair of an electron and a hole may occur in the substrate according to the amount of incident light. In some implementations, electrons generated in response to the amount of incident light may refer to photocharges. In this case, the control circuit 41 may output a first demodulation control signal (CSa) to the first control node CN1223, and may output a second demodulation control signal (CSb) to the second control node CN2334. In the first period, the first demodulation control signal (CSa) may have a higher voltage than the second demodulation control signal (CSb). In this case, the voltage of the first demodulation control signal (CSa) may be defined as an active voltage (also called an activation voltage), and the voltage of the second demodulation control signal (CSb) may be defined as an inactive voltage (also called a deactivation voltage). For example, the voltage of the first demodulation control signal (CSa) may be set to 1.2 V, and the voltage of the second demodulation control signal (CSb) may be zero volts (0V).

An electric field may occur between the first control node CN1223 and the second control node CN2334 due to a difference in voltage between the first demodulation control signal (CSa) and the second demodulation control signal (CSb), and the hole current (HC1) may flow from the first control node CN1223 to the second control node CN2334. Thus, holes in the substrate may move toward the second control node CN2334, and electrons in the substrate may move toward the first control node CN1223.

Electrons may be generated in the substrate in response to the amount of incident light, and the generated electrons may move toward the first control node CN1223, such that the electrons may be captured by the first detection node DN23a adjacent to the first control node CN1223. Therefore, electrons in the substrate may be used as signal carriers for detecting the amount of incident light.

Referring to FIG. 5, in the second period subsequent to the first period, light incident upon the pixel P23 may be processed by photoelectric conversion, and a pair of an electron and a hole may occur in the substrate according to the amount of incident light (i.e., intensity of incident light). In this case, the control circuit 41 may output the first demodulation control signal (CSa) to the first control node CN1223, and may output the second demodulation control signal (CSb) to the second control node CN2334. Here, the first demodulation control signal (CSa) may have a lower voltage than the second demodulation control signal (CSb). In this case, the voltage of the first demodulation control signal (CSa) may hereinafter be defined as an inactive voltage (i.e., deactivation voltage), and the voltage of the second demodulation control signal (CSb) may hereinafter be defined as an active voltage (i.e., activation voltage). For example, the voltage of the first demodulation control signal (CSa) may be zero volts (0V), and the voltage of the second demodulation control signal (CSb) may be set to 1.2 V.

An electric field may occur between the first control node CN1223 and the second control node CN2334 due to a difference in voltage between the first demodulation control signal (CSa) and the second demodulation control signal (CSb), and the hole current HC2 may flow from the second control node CN2334 to the first control node CN1223. That is, holes in the substrate may move toward the first control node CN1223, and electrons in the substrate may move toward the second control node CN2334.

Electrons may be generated in the substrate in response to the amount of incident light, and the generated electrons may move toward the second control node CN2334, such that the electrons may be captured by the second detection node DN23b adjacent to the second control node CN2334. Therefore, electrons in the substrate may be used as signal carriers for detecting the amount of incident light.

Figure 6A:
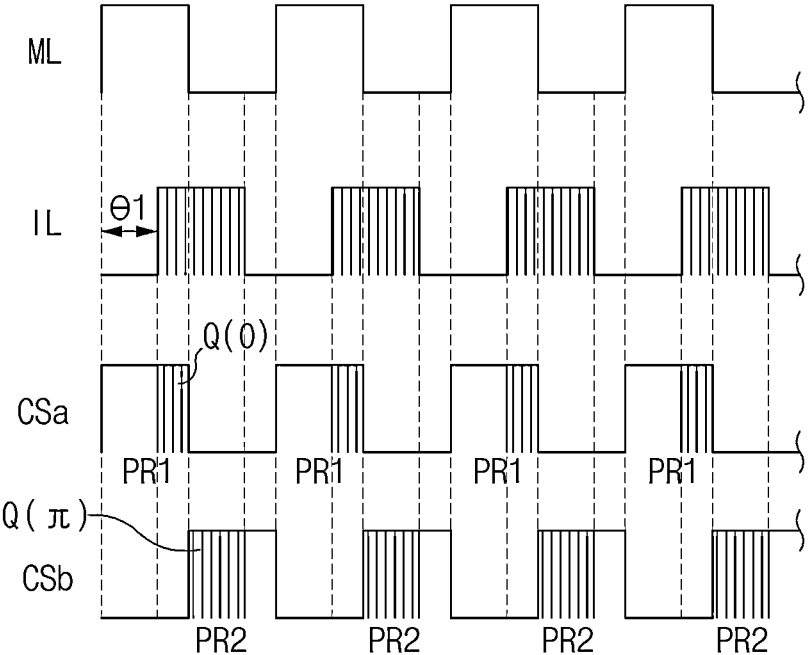
FIG. 6A is a timing diagram illustrating an example of operations of the image sensing device operating in the first mode based on some implementations of the disclosed technology.
Figure 6B:
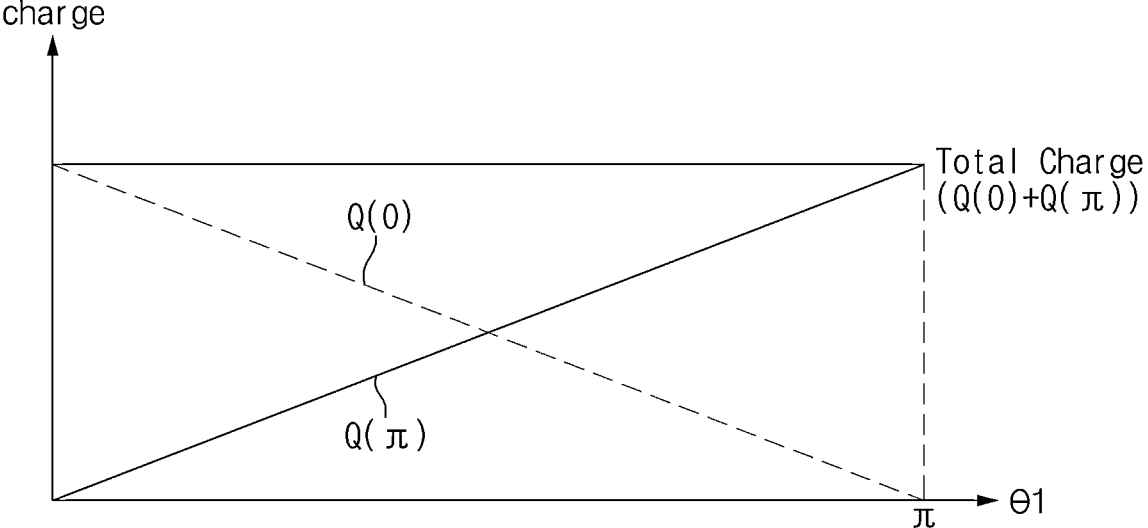
FIG. 6B is a graph illustrating an example of the principle of calculating a phase difference between modulated light and incident light in the first mode based on some implementations of the disclosed technology.

FIG. 6A is a timing diagram illustrating an example of operations of the image sensing device ISD operating in the first mode. FIG. 6B is a graph illustrating the principle of calculating a phase difference between modulated light (ML) and incident light (IL) in the first mode based on some implementations of the disclosed technology.

FIG. 6A exemplarily illustrates modulated light (ML), incident light (IL), the first demodulation control signal (CSa), and the second demodulation control signal (CSb).

Referring to FIG. 6A, the modulated light (ML) may refer to light that is emitted to the target object 1 by the light source 10 controlled by the control block 40. The modulated light (ML) may be generated to alternately have a high-level section (i.e., a period in which light is emitted) and a low-level section (i.e., a period in which light is not emitted).

The incident light (IL) may refer to light that is incident upon the substrate to generate electron-hole pairs through photoelectric conversion. The incident light (IL) may have a phase difference (θ1) that is changed with the distance between the image sensing device ISD and the target object 1.

The level of each of the modulated light (ML) and the incident light (IL) may refer to the intensity of light.

While electrons generated by the incident light (IL) are captured, each of the first demodulation control signal (CSa) and the second demodulation control signal (CSb) may alternately have a deactivation voltage (L) indicating a low level and an activation voltage (H) indicating a high level. In addition, the first demodulation control signal (CSa) may have the same phase as the modulated light (ML), and the second demodulation control signal (CSb) may have a phase difference of 180° (π) with respect to the modulated light (ML). In some implementations, it is assumed that no phase difference occurs between the light modulation signal MLS generating the modulated light (ML) and the modulated light (ML) for convenience of description, such that the light modulation signal MLS and the modulated light (ML) may have the same phase.

In a first period PR1, the first demodulation control signal (CSa) may have the activation voltage (H), and the second demodulation control signal (CSb) may have the deactivation voltage (L). Therefore, electrons generated by incident light (IL) received in the first period PR1 may move toward the first tap TA1223 by a hole current HC1, such that the electrons can be captured by the first detection node DN23a. In this case, the electrons captured by the first detection node DN23a in the first period PR1 may hereinafter be denoted by "Q(0)".

In a second period PR2, the first demodulation control signal (CSa) may have the deactivation voltage (L), and the second demodulation control signal (CSb) may have the activation voltage (H). Therefore, electrons generated by incident light (IL) received in the second period PR2 may move toward the second tap TA2334 by a hole current HC2, such that the electrons can be captured by the second detection node DN23b. In this case, the electrons captured by the second detection node DN23b in the second period PR2 may hereinafter be denoted by "Q(π)".

In other words, electrons generated by the incident light (IL) having a phase difference (θ1) that is changed with the distance between the image sensing device ISD and the target object 1, may be captured by the first detection node DN23a in the first period PR1, and may be captured by the second detection node DN23b in the second period PR2.

Referring to FIG. 6B, a graph indicating the relationship between the phase difference (θ1) and the detected electrons Q(0) and Q(π) is shown. In the graph of FIG. 6B, an X-axis may represent the amount of charges, and a Y-axis may represent a phase difference.

The total charge generated by the incident light IL may be defined as the sum of Q(0) and Q(π). As the phase difference increases, Q(π) may linearly increase and Q(0) may linearly decrease. Therefore, the phase difference (θ1) can be calculated based on the ratio between Q(0) and Q(π).

For example, the phase difference (θ1) may be calculated as represented by the following equation 1.

$$\theta 1 = \pi \cdot \frac{Q(\pi)}{Q(0) + Q(\pi)} \qquad \text{[Equation 1]}$$

An image processor (not shown) may calculate the ratio between Q(0) and Q(π) based on first image data corresponding to Q(0) captured in the first period PR1 and second image data corresponding to Q(π) captured in the second period PR2. Here, the first image data and the second image data may be received from the pixel P23. Thereafter, the image processor may calculate a phase difference based on the calculated ratio, and may thus obtain the distance between the image sensing device ISD and the target object 1.

FIGS. 7 to 10 are schematic diagrams illustrating examples of operations of the image sensing device ISD operating in the second mode based on some implementations of the disclosed technology.

Figure 7:
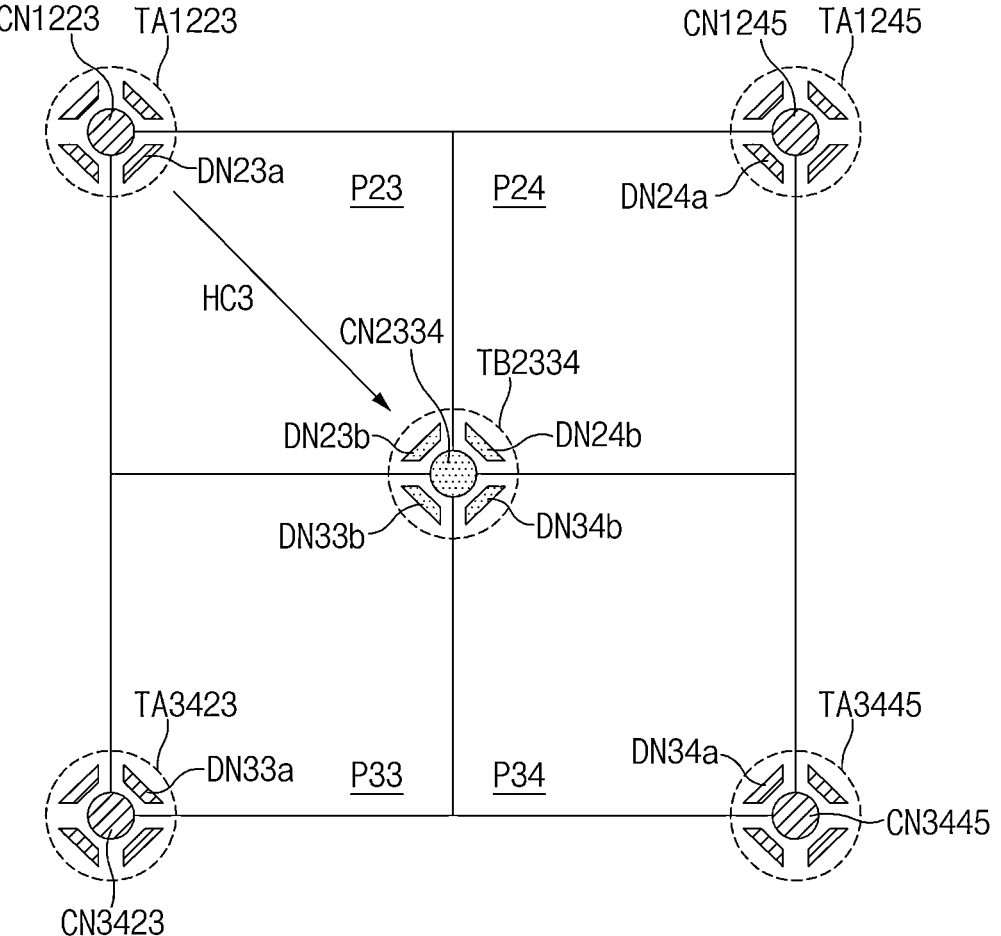

Referring to FIG. 7, the operation of capturing photocharges of the photoelectric conversion region 100 in the second mode may be performed over first to fourth periods indicating different time periods.

Also, whereas operation of the first mode is performed in units of each pixel (e.g., P23), operation of the second mode may be performed in units of a pixel group including four pixels arranged in a (2×2) matrix adjacent to each other. In FIGS. 7 to 10, a pixel group including pixels P23, P24, P33, and P34 will be described as an example for convenience of description, but the same structures and operations as those of the pixel group can also be applied to other pixel groups in the pixel array 30. If necessary, the pixel P23 may be defined as a first pixel, the pixel P24 may be defined as a third pixel, the pixel P33 may be defined as a second pixel, and the pixel P34 may be defined as a fourth pixel.

First taps TA1223, TA1245, TA3423, and TA3445 may be respectively disposed in four vertex regions of the pixel group corresponding to a rectangular shape, and a second tap TB2334 may be disposed in the center of the pixel group.

In the first period, light incident upon the pixel P23 may be processed by photoelectric conversion, such that a pair of an electron and a hole may occur in the substrate according to the amount of incident light. In this case, the control circuit 41 may output a first demodulation control signal (CSa−1) to the first control node CN1223, and may output a second demodulation control signal (CSb) to the second control node CN2334. In this case, the voltage of the first demodulation control signal (CSa−1) may be defined as an active voltage (i.e., an activation voltage), and the voltage of the second demodulation control signal (CSb) may be defined as an inactive voltage (i.e., a deactivation voltage).

An electric field may occur between the first control node CN1223 and the second control node CN2334 due to a difference in voltage between the first demodulation control signal (CSa−1) and the second demodulation control signal (CSb), and the hole current (HC3) may flow from the first control node CN1223 to the second control node CN2334. Electrons may be generated in the substrate in response to the amount of incident light, and the generated electrons may move toward the first control node CN1223, such that the electrons may be captured by the first detection node DN23a adjacent to the first control node CN1223.

Figure 8:
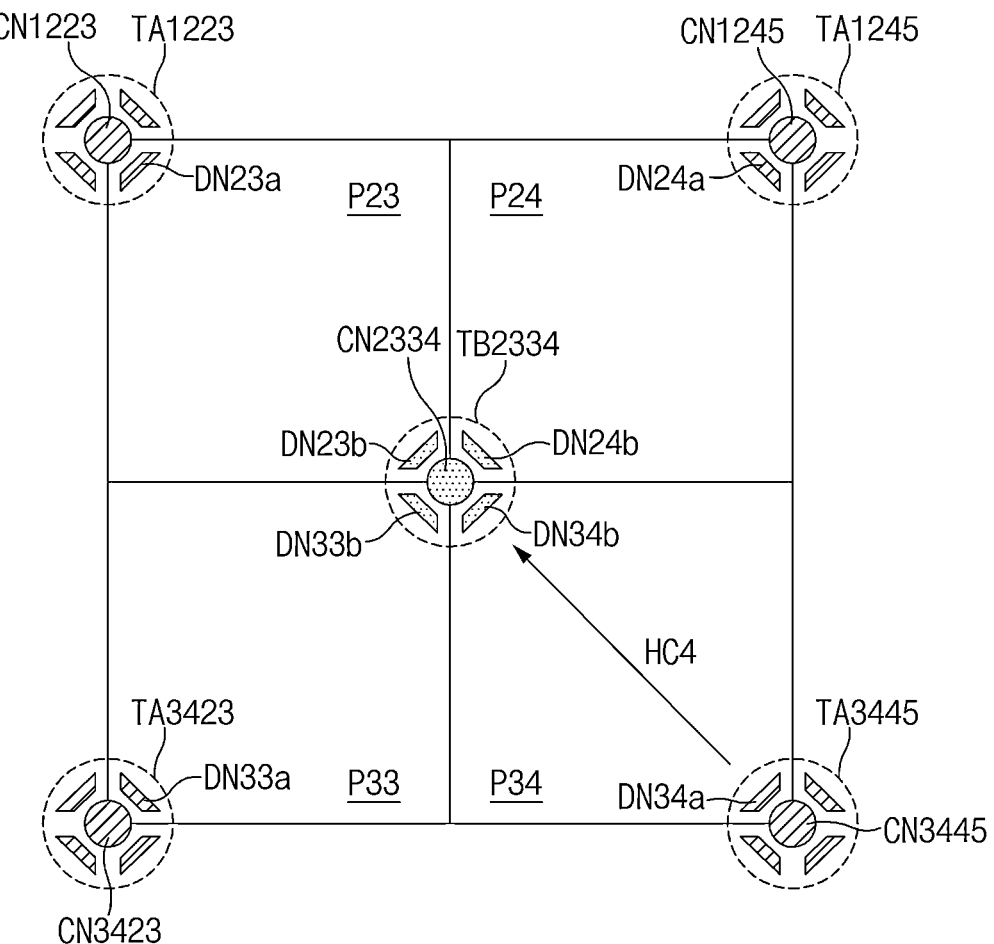

Referring to FIG. 8, in the second period subsequent to the first period, light incident upon the pixel P34 may be processed by photoelectric conversion, and a pair of an electron and a hole may occur in the substrate according to the amount of incident light (i.e., intensity of incident light). In this case, the control circuit 41 may output the first demodulation control signal (CSa−2) to the first control node CN3445, and may output the second demodulation control signal (CSb) to the second control node CN2334. In this case, the voltage of the first demodulation control signal (CSa−2) may hereinafter be defined as an active voltage (i.e., activation voltage), and the voltage of the second demodulation control signal (CSb) may hereinafter be defined as an inactive voltage (i.e., deactivation voltage).

An electric field may occur between the first control node CN3445 and the second control node CN2334 due to a difference in voltage between the first demodulation control signal (CSa−1) and the second demodulation control signal (CSb), and the hole current HC4 may flow from the first control node CN3445 to the second control node CN2334. Electrons may be generated in the substrate in response to the amount of incident light, and the generated electrons may move toward the first control node CN3445, such that the electrons may be captured by the first detection node DN34a adjacent to the first control node CN3445.

Figure 9:
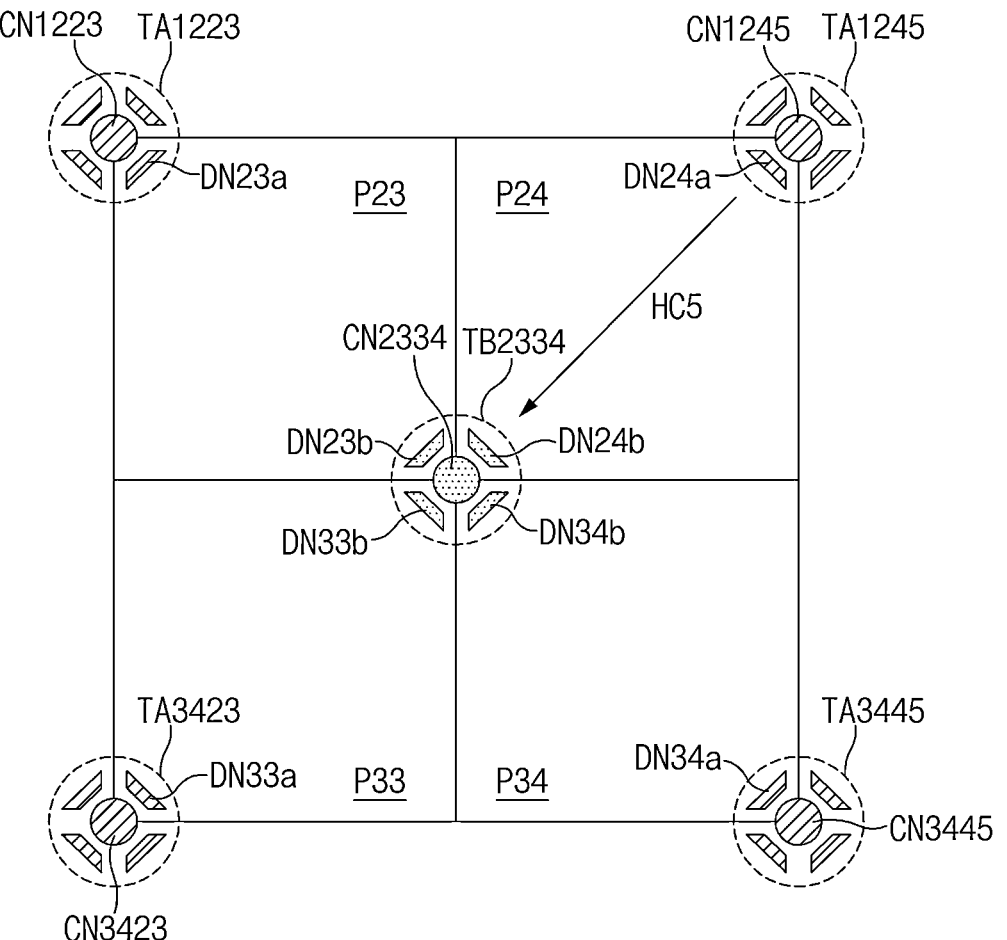

Referring to FIG. 9, in the third period, light incident upon the pixel P24 may be processed by photoelectric conversion, such that a pair of an electron and a hole may occur in the substrate according to the amount of incident light. In this case, the control circuit 41 may output a first demodulation control signal (CSa−3) to the first control node CN1245, and may output a second demodulation control signal (CSb) to the second control node CN2334. In this case, the voltage of the first demodulation control signal (CSa−3) may be defined as an active voltage (i.e., an activation voltage), and the voltage of the second demodulation control signal (CSb) may be defined as an inactive voltage (i.e., a deactivation voltage).

An electric field may occur between the first control node CN1245 and the second control node CN2334 due to a difference in voltage between the first demodulation control signal (CSa−3) and the second demodulation control signal (CSb), and the hole current (HC5) may flow from the first control node CN1245 to the second control node CN2334. Electrons may be generated in the substrate in response to the amount of incident light, and the generated electrons may move toward the first control node CN1245, such that the electrons may be captured by the first detection node DN24a adjacent to the first control node CN1245.

Referring to FIG. 10, in the fourth period subsequent to the third period, light incident upon the pixel P33 may be processed by photoelectric conversion, and a pair of an electron and a hole may occur in the substrate according to the amount of incident light (i.e., intensity of incident light). In this case, the control circuit 41 may output the first demodulation control signal (CSa−4) to the first control node CN3423, and may output the second demodulation control signal (CSb) to the second control node CN2334. In this case, the voltage of the first demodulation control signal (CSa−4) may hereinafter be defined as an active voltage (i.e., activation voltage), and the voltage of the second demodulation control signal (CSb) may hereinafter be defined as an inactive voltage (i.e., deactivation voltage).

An electric field may occur between the first control node CN3423 and the second control node CN2334 due to a difference in voltage between the first demodulation control signal (CSa−4) and the second demodulation control signal (CSb), and the hole current HC6 may flow from the first control node CN3423 to the second control node CN2334. Electrons may be generated in the substrate in response to the amount of incident light, and the generated electrons may move toward the first control node CN3423, such that the electrons may be captured by the first detection node DN33a adjacent to the first control node CN3423.

In other words, in the first to fourth periods, the activation voltage may be applied to the first control nodes CN1223, CN1245, CN3423, and CN3445 at different timing points, and the deactivation voltage may be continuously applied to the second control node CN2334.

Figure 11A:
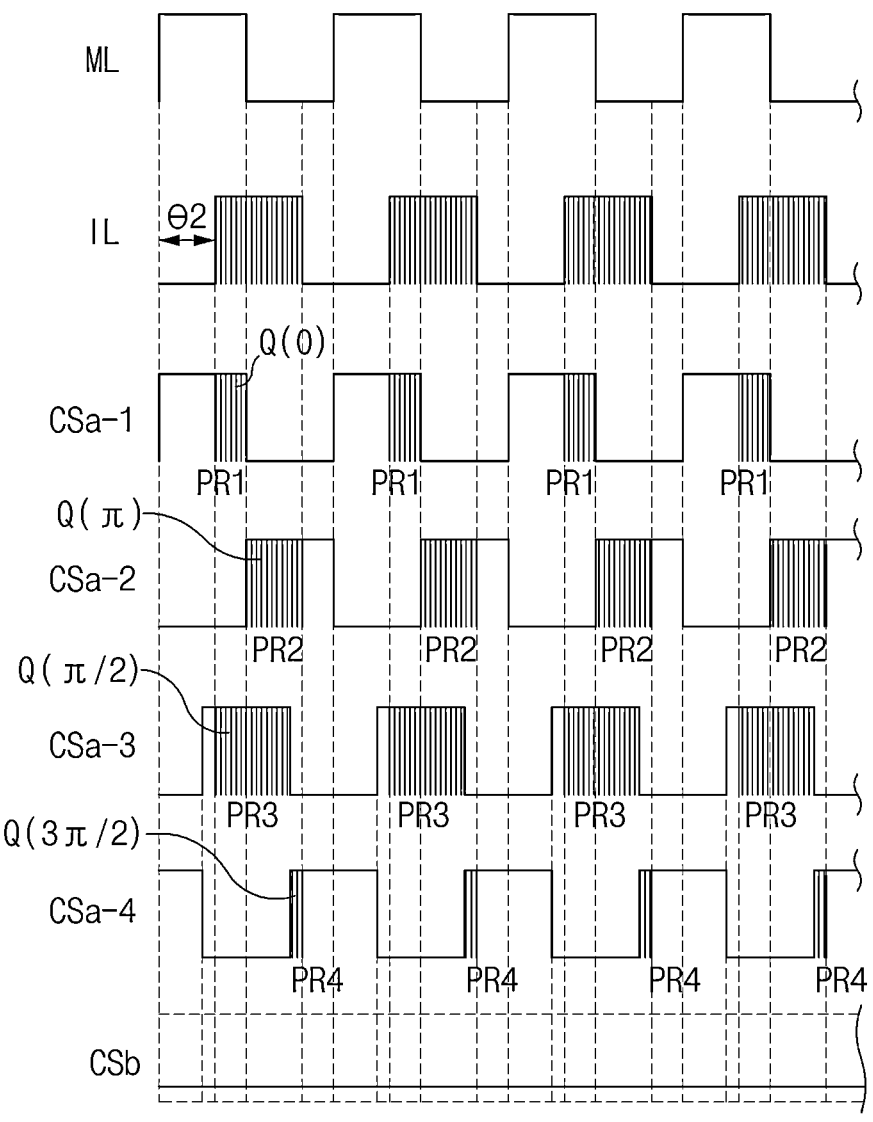
FIG. 11A is a timing diagram illustrating an example of operations of the image sensing device operating in the second mode based on some implementations of the disclosed technology.
Figure 11B:
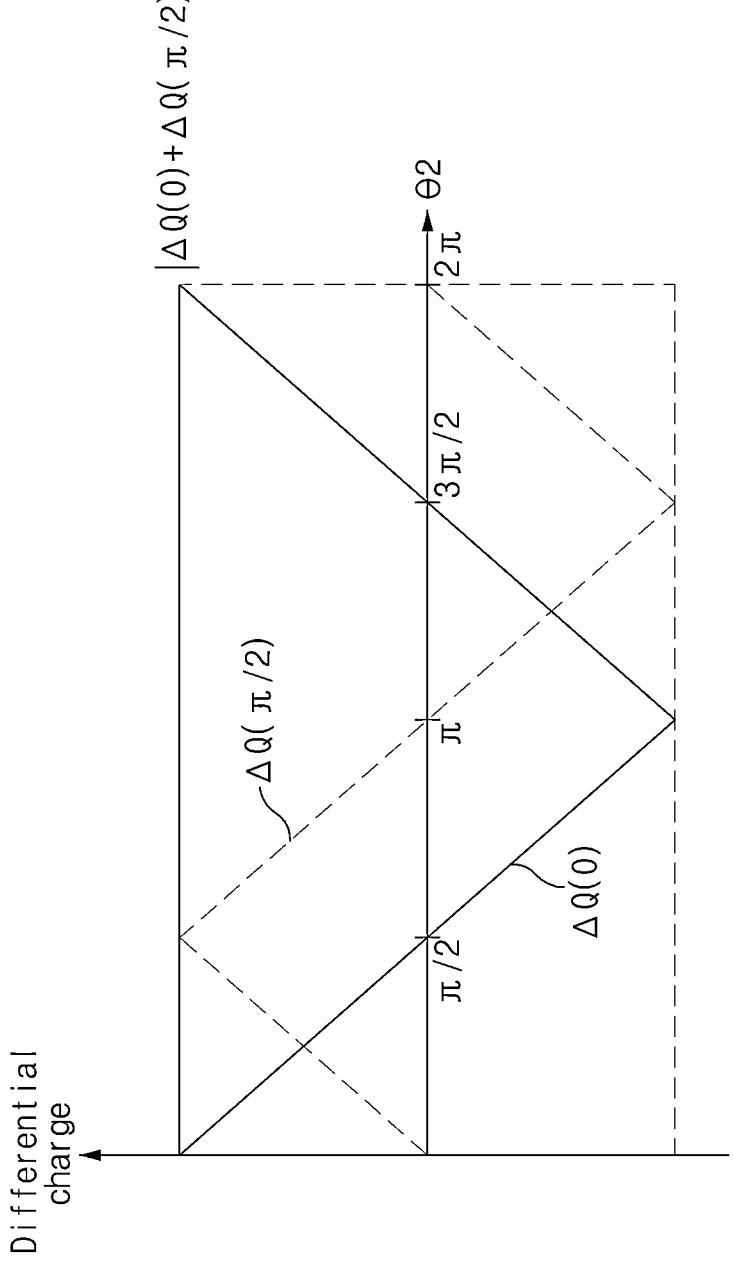
FIG. 11B is a diagram illustrating the principle of calculating a phase difference between modulated light and incident light in the second mode based on some implementation of the disclosed technology.

FIG. 11A is a timing diagram illustrating an example of operations of the image sensing device operating in the second mode based on some implementations of the disclosed technology. FIG. 11B is a diagram illustrating the principle of calculating a phase difference between modulated light (ML) and incident light (IL) in the second mode based on some implementation of the disclosed technology.

FIG. 11A illustrates examples of modulated light (ML), incident light (IL), the first demodulation control signals (CSa–1, CSa–2, CSa–3, CSa–4) and the second demodulation control signal (CSb).

The modulated light (ML) and the incident light (IL) are substantially the same as those of FIG. 6A, and as such a detailed description thereof will herein be omitted for brevity. The incident light (IL) may have a phase difference ($\theta$2) that is changed with the distance between the image sensing device ISD and the target object 1.

While electrons generated by the incident light (IL) are captured, each of the first demodulation control signals (CSa–1, CSa–2, CSa–3, CSa–4 may alternately have a deactivation voltage (L) indicating a low level and an activation voltage (H) indicating a high level. While electrons generated by the incident light (IL) are captured, the second demodulation control signal (CSb) can be maintained at the deactivation voltage. In addition, the first demodulation control signal (CSa–1) may have the same phase as the modulated light (ML), and the first demodulation control signal (CSa–2) may have a phase opposite to that of the modulated light (ML) (i.e., a phase difference of 180° ($\pi$) with respect to the modulated light ML). Meanwhile, the first demodulation control signal (CSa–3) may be a signal having a phase difference of 90° ($\pi/2$) with respect to the modulated light (ML), and the first demodulation control signal (CSa–4) may be a signal having a phase difference of 270° ($3\pi/2$) with respect to the modulated light (ML).

In a first period PR1, the first demodulation control signal (CSa–1) may have the activation voltage (H), and the second demodulation control signal (CSb) may have the deactivation voltage (L). Therefore, electrons generated by incident light (IL) received in the first period PR1 may move toward the first tap TA1223 by a hole current HC3, such that the electrons can be captured by the first detection node DN23$a$. In this case, the electrons captured by the first detection node DN23$a$ in the first period PR1 may hereinafter be denoted by "Q(0)".

In a second period PR2, the first demodulation control signal (CSa–2) may have the activation voltage (H), and the second demodulation control signal (CSb) may have the deactivation voltage (L). Therefore, electrons generated by incident light (IL) received in the second period PR2 may move toward the first tap TA3445 by a hole current HC4, such that the electrons can be captured by the first detection node DN34$a$. In this case, the electrons captured by the first detection node DN34$a$ in the second period PR2 may hereinafter be denoted by "Q($\pi$)".

In a third period PR3, the first demodulation control signal (CSa–3) may have the activation voltage (H), and the second demodulation control signal (CSb) may have the deactivation voltage (L). Therefore, electrons generated by incident light (IL) received in the third period PR3 may move toward the first tap TA1245 by a hole current HC5, such that the electrons can be captured by the first detection node DN24$a$. In this case, the electrons captured by the first detection node DN24$a$ in the third period PR3 may hereinafter be denoted by "Q($\pi/2$)".

In a fourth period PR4, the first demodulation control signal (CSa–4) may have the activation voltage (H), and the second demodulation control signal (CSb) may have the deactivation voltage (L). Therefore, electrons generated by incident light (IL) received in the fourth period PR4 may move toward the first tap TA3423 by a hole current HC5, such that the electrons can be captured by the first detection node DN33$a$. In this case, the electrons captured by the first detection node DN33$a$ in the fourth period PR4 may hereinafter be denoted by "Q($3\pi/2$)".

In other words, electrons generated by the incident light (IL) having a phase difference ($\theta$2) that is changed with the distance between the image sensing device ISD and the target object 1, may be captured by the first detection node DN23$a$ in the first period PR1, may be captured by the first detection node DN34$a$ in the second period PR2, may be captured by the first detection node DN24$a$ in the third period PR3, and may be captured by the first detection node DN33$a$ in the fourth period PR4.

Operation of the second mode may be performed in units of a pixel group including four pixels (P23, P24, P33, P34) arranged in a (2×2) matrix adjacent to each other. The first detection node DN23$a$ may capture electrons generated by the incident light (IL) incident upon the pixel group in the first period PR1, and the first detection node DN34$a$ may capture electrons generated by the incident light (IL) incident upon the pixel group in the second period PR2. The first detection node DN24$a$ may capture electrons generated by the incident light (IL) incident upon the pixel group in the third period PR3, and the first detection node DN33$a$ may capture electrons generated by the incident light (IL) incident upon the pixel group in the fourth period PR4.

Although the image sensing device based on some implementations of the disclosed technology has been disclosed centering upon the pixel group including the four pixels P23, P24, P33, and P34, other implementations are also possible. In some implementations, the respective four first detection nodes surrounding the first control node CN1223 can capture electrons generated by incident light (IL) that is incident upon different pixel groups in the first period PR1, and the respective four first detection nodes surrounding the first control node CN3445 can capture electrons generated by incident light (IL) that is incident upon different pixel groups in the second period PR2. In addition, the respective four first detection nodes surrounding the first control node CN1245 can capture electrons generated by incident light (IL) that is incident upon different pixel groups in the third period PR3, and the respective four first detection nodes surrounding the first control node CN3423 can capture electrons generated by incident light (IL) that is incident upon different pixel groups in the fourth period PR4.

Accordingly, the position of the first tap corresponding to each of the first to fourth periods PR1 to PR4 in any pixel group included in the pixel array 30 may vary for each pixel group. For example, in association with a pixel group formed by the four pixels (P21, P22, P31, P32), a first tap corresponding to the first period PR1 may be denoted by TA1223, a first tap corresponding to the second period PR2 may be denoted by TA3401, a first tap corresponding to the third period PR3 may be denoted by TA1201, and a first tap corresponding to the fourth period PR4 may be denoted by TA3423.

In the pixel array of FIG. 2, when demodulation control signals are applied as shown in FIG. 11A, the pixels (P12, P13, P16, P22, P23, P26) may capture electrons in the first period PR1, the pixels (P31, P34, P35, P41, P44, P45) may capture electrons in the second period PR2, the pixels (P11, P14, P15, P21, P24, P25) may capture electrons in the third period PR3, and the pixels (P32, P33, P36, P42, P43, P46) may capture electrons in the fourth period PR4.

Also, a time period corresponding to any one first tap in one pixel group may also be changed without being fixed.

Referring to FIG. 11B, a graph indicating the relationship between the phase difference ($\theta$2) and the detected electrons Q(0), Q($\pi/2$), Q($\pi$), and Q($3\pi/2$) is shown. In the graph of FIG. 11B, an X-axis may represent the amount of charges, and a Y-axis may represent a phase difference.

For convenience of description, it is assumed that electrons generated by the incident light (IL) incident upon the pixel group are captured while being divided into a first period PR1 and a second period PR2 or while being divided into a third period PR3 and a fourth period PR4, and the amount of charges captured in the first and second periods PR1 and PR2 is equal to the amount of charges captured in the third and fourth periods PR3 and PR4. That is, the total charge generated by the incident light (IL) may be defined as the sum of Q(0) and Q($\pi$) or the sum of Q($\pi$/2) and Q(3$\pi$/2).

In addition, the absolute value of a difference between Q(0) and Q($\pi$) will hereinafter be defined as $\Delta$Q(0) (=|Q(0)−Q($\pi$)|), and the absolute value of a difference between Q($\pi$/2) and Q(3$\pi$/2) will hereinafter be defined as $\Delta$Q($\pi$/2) (=|Q($\pi$/2) Q(3$\pi$/2)|). As the first demodulation control signal (CSa−1) for obtaining Q(0) and the first demodulation control signal (CSa−2) for obtaining Q($\pi$) have a phase difference of 90° with respect to the first demodulation control signal (CSa−3) for obtaining Q($\pi$/2) and the first demodulation control signal (CSa−4) for obtaining Q(3$\pi$/2), the sum of $\Delta$Q(0) and $\Delta$Q($\pi$/2) may have a constant value (i.e., the total amount of electrons).

For the sum of $\Delta$Q(0) and $\Delta$Q($\pi$/2) having constant values, the change in $\Delta$Q(0) and $\Delta$Q($\pi$/2) according to the phase difference ($\theta$2) is shown in the graph of FIG. 11B. That is, as the phase difference ($\theta$2) increases, $\Delta$Q(0) decreases linearly in a period where the phase difference ($\theta$2) ranges from 0 to $\pi$, and then increases linearly in a period where the phase difference ($\theta$2) ranges from $\pi$ to 2$\pi$. $\Delta$Q($\pi$/2) may increase linearly in a period where the phase difference ($\theta$2) ranges from 0 to $\pi$/2, may decrease linearly in a period where the phase difference ($\theta$2) ranges from $\pi$/2 to 3$\pi$/2, and may increase linearly in a period where the phase difference ($\theta$2) ranges from 3$\pi$/2 to 2$\pi$. Therefore, the phase difference can be calculated based on the ratio relationship between $\Delta$Q(0) and $\Delta$Q($\pi$/2).

For example, the phase difference ($\theta$2) may be calculated as represented by the following equation 2.

$$\theta2 = \begin{cases} \dfrac{\pi}{2} \cdot \left(1 + \dfrac{-\Delta Q(0)}{|\Delta Q(0)| + \left|\Delta Q\left(\frac{\pi}{2}\right)\right|}\right), & \text{if } \Delta Q\left(\dfrac{\pi}{2}\right) \geq 0 \\[4mm] \dfrac{\pi}{2} \cdot \left(3 + \dfrac{+\Delta Q(0)}{|\Delta Q(0)| + \left|\Delta Q\left(\frac{\pi}{2}\right)\right|}\right), & \text{if } \Delta Q\left(\dfrac{\pi}{2}\right) < 0 \end{cases} \quad \text{[Equation 2]}$$

The image processor (not shown) may calculate $\Delta$Q(0) and $\Delta$Q($\pi$/2) based on first image data corresponding to Q(0) captured in the first period PR1, second image data corresponding to Q($\pi$) captured in the second period PR2, third image data corresponding to Q($\pi$/2) captured in the third period PR3, and fourth image data corresponding to Q(3$\pi$/2) captured in the fourth period PR4, may calculate a phase difference by calculating the ratio between $\Delta$Q(0) and $\Delta$Q($\pi$/2), and may thus obtain the distance between the image sensing device ISD and the target object 1. Here, the first image data, the second image data, the third image data, and the fourth image data may be received from the pixels (P23, P24, P33, P34) included in the pixel group.

In particular, according to the 4-phase modulation method such as the second mode, differential values such as $\Delta$Q(0) and $\Delta$Q($\pi$/2) may be used to calculate a phase difference, components caused by background noise included in each of Q(0), Q($\pi$), Q($\pi$/2) and Q(3$\pi$/2) can be removed (or cancelled), so that the distance to the target object can be more accurately calculated. In addition, since the image sensing device can simultaneously obtain Q(0), Q($\pi$), Q($\pi$/2), and Q(3$\pi$/2) through only one image capture, the distance calculation speed can be improved and the distance to an object moving at a high speed can be precisely calculated with higher accuracy.

Figure 12A:
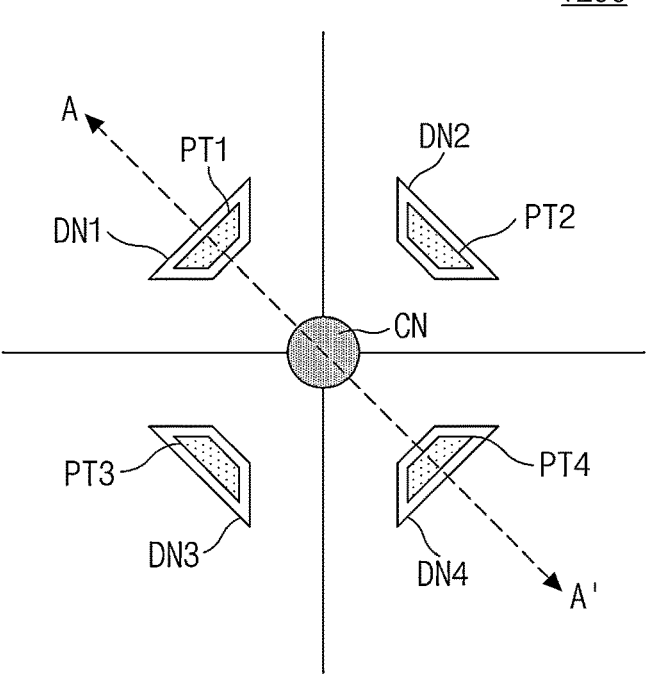
FIG. 12A is a diagram illustrating an embodiment of a tap disposed in the pixel array shown in FIG. 2 based on some implementations of the disclosed technology.

FIG. 12A is a diagram illustrating an embodiment of a tap 1200 disposed in the pixel array shown in FIG. 2 based on some implementations of the disclosed technology.

Referring to FIG. 12A, the tap 1200 may correspond to any one of first taps (e.g., TA1201) or second taps (e.g., TB0112), which is included in the pixel array 30 shown in FIG. 2. For example, when the tap 1200 corresponds to the second tap TB2334, the control node CN may correspond to the control node CN2334 of FIG. 2, the first detection node DN1 may correspond to the detection node DN23$b$ of FIG. 2, the second detection node DN2 may correspond to the detection node DN24$b$ of FIG. 2, the third detection node DN3 may correspond to the detection node DN33$b$ of FIG. 2, and the fourth detection node DN4 may correspond to the detection node DN34$b$ of FIG. 2. In the above examples up to FIG. 11B, the first detection node is a detection node included in the first tap and the second detection node is a detection node included in the second tap. In the description below, the first detection node refers to a detection node disposed in the left-upper direction from the control node, the second detection node refers to a detection node disposed in the right-upper direction from the control node, the third detection node refers to a detection node disposed in the left-lower direction from the control node, and the fourth detection node refers to a detection node disposed in the right-lower direction from the control node.

The tap 1200 may include the control node CN, the first to fourth detection nodes DN1 to DN4, and the first to fourth potential adjustment regions PT1 to PT4. The first to fourth potential adjustment regions PT1 to PT4 may overlap the first to fourth detection nodes DN1 to DN4, respectively. For example, the first potential adjustment region PT1 may overlap the first detection node DN1 and have a shape corresponding to the shape of the first detection node DN1 when viewed in a plane, and the fourth potential adjustment region PT4 may overlap the fourth detection node DN4 and have a shape corresponding to the fourth detection node DN4 when viewed in a plane. In the embodiment of FIG. 12A, the first to fourth potential adjustment regions PT1 to PT4 may be smaller in size than the first to fourth detection nodes DN1 to DN4. In some implementations, the first potential adjustment region PT1 may be smaller in size than the first detection node DN1, the second potential adjustment region PT2 may be smaller in size than the second detection node DN2, the third potential adjustment region PT3 may be smaller in size than the third detection node DN3, and the fourth potential adjustment region PT4 may be smaller in size than the fourth detection node DN4.

Figure 12B:
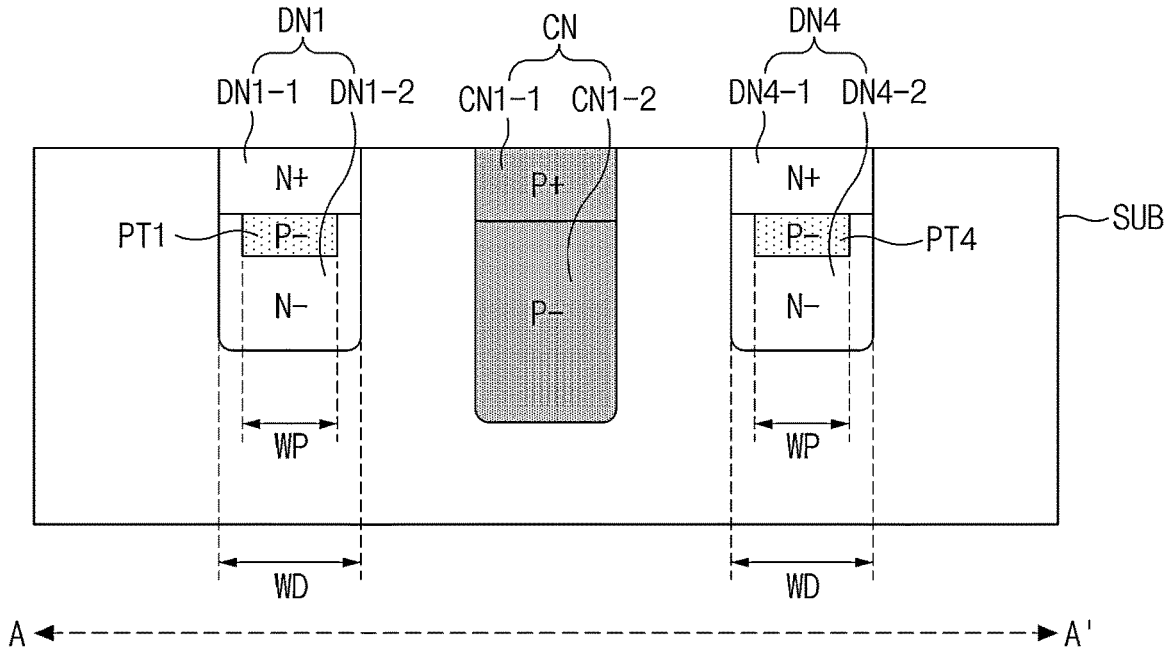
FIG. 12B is a cross-sectional view illustrating a cross-sectional structure of a tap taken along a first cutting line shown in FIG. 12A based on some implementations of the disclosed technology.

FIG. 12B is a cross-sectional view illustrating a cross-sectional structure of the tap 1200 taken along the first cutting line A-A' shown in FIG. 12A based on some implementations of the disclosed technology.

Referring to FIG. 12B, the tap 1200 may be included within the substrate SUB and implemented as a stacked structure that is in contact with a first surface of a substrate SUB. Here, the first surface may be a surface facing (or opposite to) a surface upon which light is incident.

The control node CN of the tap 1200 may include a P$^+$ impurity region CN1-1 that is in contact with the first surface of the substrate SUB and a P$^-$ impurity region CN1-2 disposed under the P$^+$ impurity region CN1-1. The P$^+$ impurity region CN1-1 may be a region doped with P-type impurities having a relatively high concentration than the P$^-$ impurity region CN1-2. The P$^+$ impurity region CN1-1 and the P$^-$ impurity region CN1-2 may form a potential gradient so that a hole current may flow more smoothly. The control node CN may have a greater depth from the first surface than each of the first detection node DN1 and the fourth detection node DN4.

The first detection node DN1 of the tap 1200 may include an N$^+$ impurity region DN1-1 that is in contact with the first surface of the substrate SUB and an N$^+$ impurity region DN1-2 disposed under the N$^+$ impurity region DN1-1. The N$^+$ impurity region DN1-1 may be a region doped with N-type impurities having a relatively high concentration than the N$^-$ impurity region DN1-2. The N$^+$ impurity region DN1-1 and the N$^-$ impurity region DN1-2 may form a potential gradient so that photocharges can be more easily captured by the N$^+$ impurity region DN1-1. The N$^+$ impurity region DN1-1 may be referred to as a first doped region, and the N$^-$ region DN1-2 may be referred to as a second doped region.

A first potential adjustment region PT1 may be disposed between the N$^+$ impurity region DN1-1 and the N$^-$ impurity region DN1-2. The first potential adjustment region PT1 may be a region doped with P-type impurities (P−) having a relatively low concentration.

If the first potential adjustment region PT1 is not disposed between the N$^+$ impurity region DN1-1 and the N$^-$ impurity region DN1-2, there may occur an electrical potential gradually increasing from the substrate SUB to the N$^-$ impurity region DN1-2 or gradually increasing from the N$^-$ impurity region DN1-2 to the N$^+$ impurity region DN1-1. Photocharges obtained by photoelectric conversion in the substrate SUB may easily move toward the N$^+$ impurity region DN1-1 by this potential gradient, and may thus be captured in the N$^+$ impurity region DN1-1. In a period (e.g., the first period PR1 of FIG. 6A when the tap 1200 corresponds to the first tap) in which the first detection node DN1 needs to capture photocharges, the potential gradient may help to quickly capture the photocharges. However, the potential gradient may make photocharges move toward the N$^+$ impurity region even in a period (e.g., the second period PR2 of FIG. 6A when the tap 1200 corresponds to the first tap) in which the first detection node DN1 is not supposed to capture photocharges. The photocharges moved toward N$^+$ impurity region may then be captured and accumulated, which results in deteriorating demodulation contrast by generating noise in image data obtained from photocharges captured by the first detection node DN1.

Referring to FIG. 12B, while the electrical potential gradually increasing in the direction from the substrate SUB to the N$^-$ impurity region DN1-2 or in the direction from the N$^-$ impurity region DN1-2 to the N$^+$ impurity region DN1-1 is formed in the tap, the first potential adjustment region PT1 is disposed between the N$^+$ impurity region DN1-1 and the N$^-$ impurity region DN1-2. By the first potential adjustment region PT1 having a conductivity type opposite to that of the N$^+$ impurity region DN1-1, a depletion region acting as a potential barrier interfering with movement of photocharges may be formed near a boundary between the N$^+$ impurity region DN1-1 and the first potential adjustment region PT1. Due to this potential barrier, it is possible to prevent photocharges from moving toward the N$^+$ impurity region DN1-1 and being captured in a period where the first detection node DN1 is not supposed to capture the photocharges. Thus, the noise blocking capability of the first detection node DN1 can be improved. In addition, the doping concentration of the first potential adjustment region PT1 can be experimentally determined such that the charge collection capability for enabling the potential barrier to quickly capture photocharges in a period where the first detection node DN1 is supposed to capture photocharges is not deteriorated. For example, the doping concentration of P-type impurities of the first potential adjustment region PT1 may be about 100 to 1000 times smaller than the doping concentration of N-type impurities of the N$^+$ impurity region DN1-1.

In addition, the width WP of the first potential adjustment region PT1 may be smaller than the width WD of the first detection node DN1.

Meanwhile, the N$^+$ impurity region DN1-1 may be formed by arranging a mask defining the N$^+$ impurity region DN1-1 therein, the first potential adjustment region PT1 may be formed by arranging a mask defining the first potential adjustment region PT1 therein, and the N$^-$ impurity region DN1-2 may be formed by arranging a mask defining the N$^-$ impurity region DN1-2 therein. For example, the N$^-$ impurity region DN1-2 may be formed by arranging a mask defining the N$^-$ impurity region DN1-2 therein, the first potential adjustment region PT1 may then be performed by arranging a mask defining the first potential adjustment region PT1 therein, and the N$^+$ impurity region DN1-1 may be finally formed by arranging a mask defining the N$^+$ impurity region DN1-1 therein, such that the N$^-$ impurity region DN1-2, the first potential adjustment region PT1, and N$^+$ impurity region DN1-1 can be sequentially formed, but is not limited thereto.

The fourth detection node DN4 of the tap 1200 may include an N$^+$ impurity region DN4-1 that is in contact with the first surface of the substrate SUB and an N$^-$ impurity region DN4-2 disposed under the N$^+$ impurity region DN4-1. A fourth potential adjustment region PT4 may be disposed between the N$^+$ impurity region DN4-1 and the N$^-$ impurity region DN4-2. The structures, materials, formation methods, and functions of the fourth detection node DN4 and the fourth potential adjustment region PT4 are substantially the same as those described with respect to the first detection node DN1 and the first potential adjustment region PT1, and as such redundant description thereof will herein be omitted for brevity.

In addition, although the embodiments of FIGS. 12A and 12B have been described focusing upon the first and fourth detection nodes DN1 and DN4 and the first and fourth potential adjustment regions PT1 and PT4 respectively overlapping the first and fourth detection nodes DN1 and DN4, substantially the same description can also be applied to the second and third detection nodes DN2 and DN3 and the second and third potential adjustment regions PT2 and PT3 respectively overlapping the second and third detection nodes DN2 and DN3.

Figure 13A:
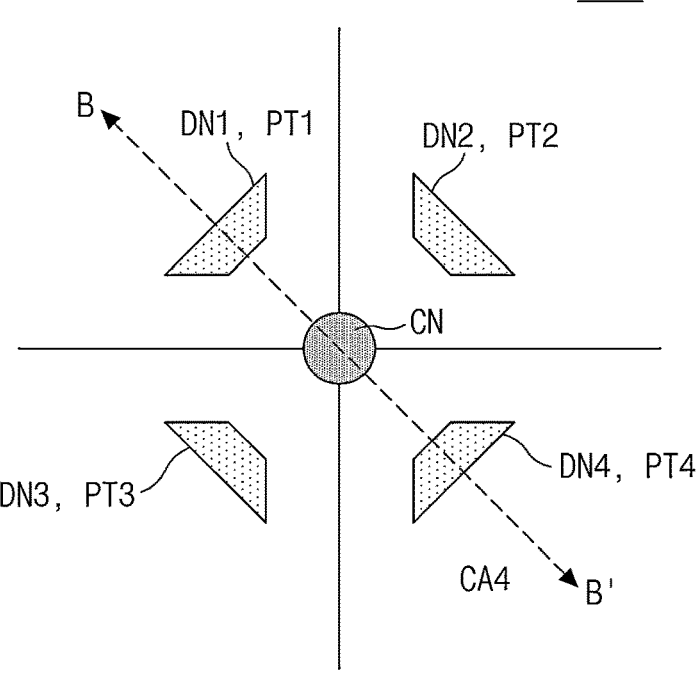
FIG. 13A is a diagram illustrating another example of a tap disposed in the pixel array shown in FIG. 2 based on some implementations of the disclosed technology.

FIG. 13A is a diagram illustrating another example of a tap disposed in the pixel array shown in FIG. 2 based on some implementations of the disclosed technology.

Referring to FIG. 13A, a tap 1300 may correspond to any one of first taps (e.g., TA1201) and second taps (e.g., TB0112) included in the pixel array 30 shown in FIG. 2.

The tap 1300 may include the first to fourth potential adjustment regions PT1 to PT4 together with the control node CN and the first to fourth detection nodes DN1 to DN4. The first to fourth potential adjustment regions PT1 to PT4 may overlap the first to fourth detection nodes DN1 to DN4, respectively. In more detail, the first potential adjustment region PT1 may overlap the first detection node DN1 and have a shape corresponding to the shape of the first detection node DN1 when viewed in a plane, the second potential adjustment region PT2 may overlap the second detection node DN2 and have a shape corresponding to the shape of the second detection node DN2 when viewed in a plane, the third potential adjustment region PT3 may overlap the third detection node DN3 and have a shape corresponding to the third detection node DN3 when viewed in a plane, and the fourth potential adjustment region PT4 may overlap the fourth detection node DN4 and have a shape corresponding to the fourth detection node DN4 when viewed in a plane. In the embodiment of FIG. 13A, the first to fourth potential adjustment regions PT1 to PT4 may be identical in size to the first to fourth detection nodes DN1 to DN4, respectively.

Figure 13B:
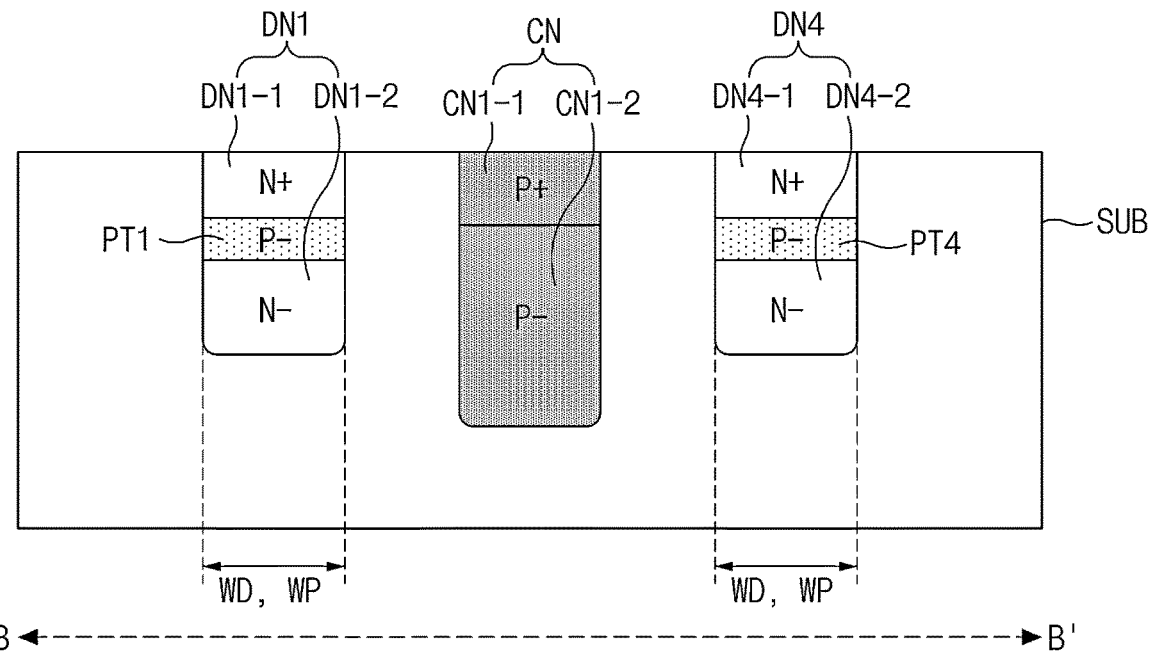
FIG. 13B is a cross-sectional view illustrating an example of a cross-sectional structure of a tap taken along a second cutting line shown in FIG. 13A based on some implementations of the disclosed technology.

FIG. 13B is a cross-sectional view illustrating a cross-sectional structure of the tap 1300 taken along the second cutting line B-B' shown in FIG. 13A based on some implementations of the disclosed technology.

Referring to FIG. 13B, the tap 1300 may be implemented as a stacked structure that is in contact with a first surface of a substrate SUB within the substrate SUB.

The remaining components of the tap 1300 other than some structures different from those of the tap 1200 of FIG. 12B may be substantially identical in structure, material, formation method, and function to those of the tap 1200 shown in FIG. 12B, and as such redundant description thereof will herein be omitted for brevity. For convenience of description, the tap 1300 shown in FIG. 13B will hereinafter be described centering upon characteristics different from those of the tap 1200 shown in FIG. 12B.

The width WP of the first potential adjustment region PT1 may be the same as the width WD of the first detection node DN1.

As the width WP of the first potential adjustment region PT1 shown in FIG. 13B increases as compared to that of FIG. 12B, the potential barrier formed by the depletion region formed at a boundary between the first potential adjustment region PT1 and the N$^+$ impurity region DN1-1 can be formed over a wider region. Accordingly, it is possible to further improve the noise blocking capability of preventing photocharges from moving toward the N$^+$ impurity region DN1-1 and being captured in a period where the first detection node DN1 is not supposed to capture photocharges. In the implementations, the doping concentration of the first potential adjustment region PT1 can be experimentally determined so that the charge collection capability for enabling the potential barrier to quickly capture photocharges is not lowered more than necessary in a period where the first detection node DN1 needs to capture photocharges.

Although the embodiment of FIG. 13B has been described focusing upon the first potential adjustment region PT1, substantially the same description as given above can also be applied to the second to fourth potential adjustment regions PT2 to PT4.

Figure 14A:
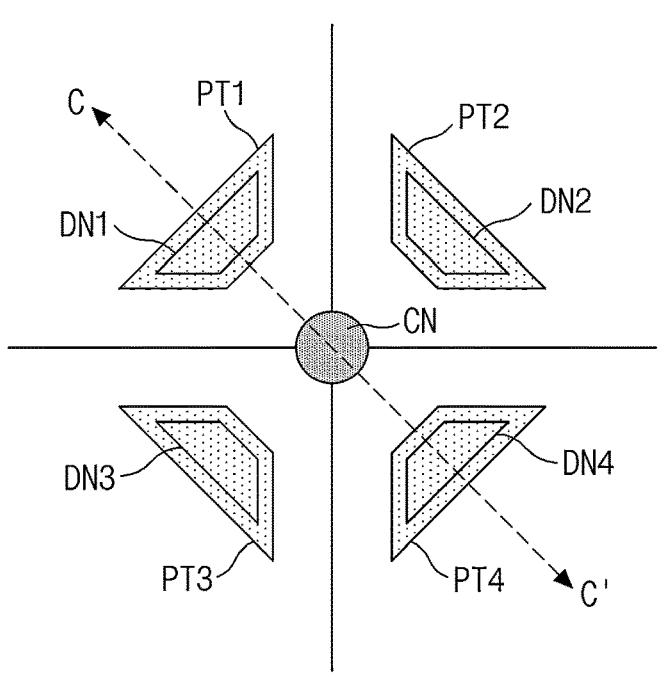
FIG. 14A is a diagram illustrating still another example of a tap disposed in the pixel array shown in FIG. 2 based on some implementations of the disclosed technology.

FIG. 14A is a diagram illustrating still another example of a tap 1400 disposed in the pixel array 30 shown in FIG. 2 based on some implementations of the disclosed technology.

Referring to FIG. 14A, a tap 1400 may correspond to any one of first taps (e.g., TA1201) and second taps (e.g., TB0112) included in the pixel array 30 shown in FIG. 2.

The tap 1400 may include the first to fourth potential adjustment regions PT1 to PT4 together with the control node CN and the first to fourth detection nodes DN1 to DN4.

The first to fourth potential adjustment regions PT1 to PT4 may overlap the first to fourth detection nodes DN1 to DN4, respectively. In more detail, the first potential adjustment region PT1 may overlap the first detection node DN1 and have a shape corresponding to the shape of the first detection node DN1 when viewed in a plane, and the fourth potential adjustment region PT4 may overlap the fourth detection node DN4 and have a shape corresponding to the fourth detection node DN4 when viewed in a plane. In the embodiment of FIG. 14A, the first to fourth potential adjustment regions PT1 to PT4 may be larger in size than the first to fourth detection nodes DN1 to DN4, respectively.

Therefore, each of the first to fourth potential adjustment regions PT1 to PT4 may include a region that overlaps each of the first to fourth detection nodes DN1 to DN4, and a region that does not overlap each of the first to fourth detection nodes DN1 to DN4.

Figure 14B:
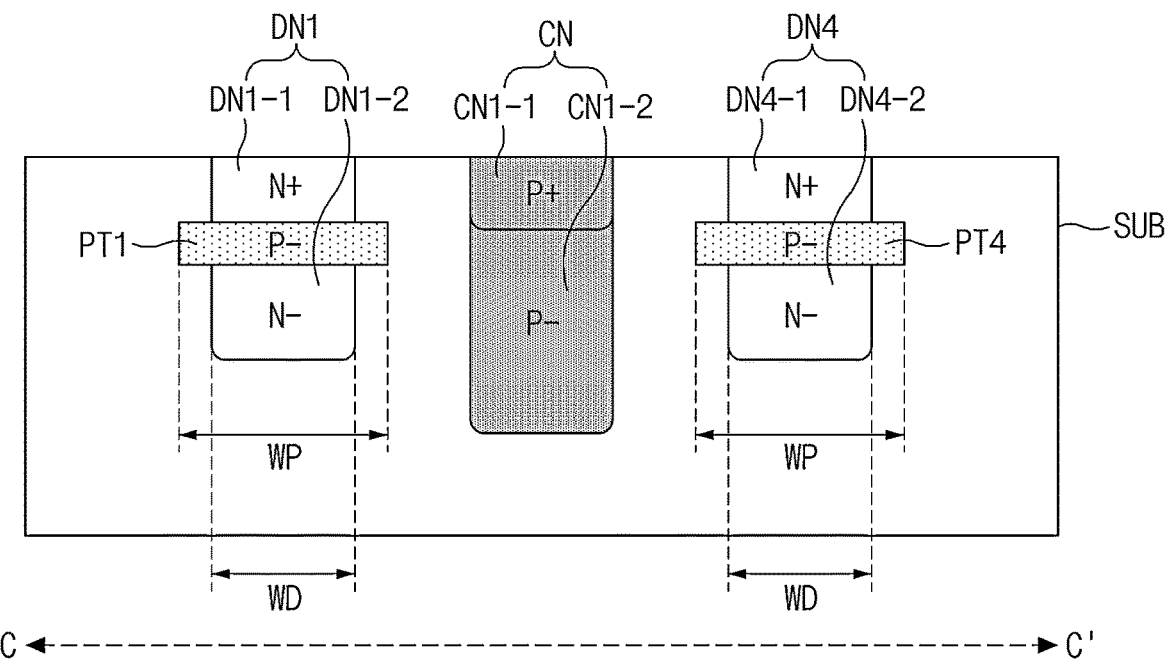
FIG. 14B is a cross-sectional view illustrating an example of a cross-sectional structure of a tap taken along a third cutting line shown in FIG. 14A based on some implementations of the disclosed technology.

FIG. 14B is a cross-sectional view illustrating an example of a cross-sectional structure of a tap 1400 taken along the third cutting line C-C' shown in FIG. 14A based on some implementations of the disclosed technology.

Referring to FIG. 14B, the tap 1300 may be implemented as a stacked structure that is in contact with a first surface of a substrate SUB within the substrate SUB.

The remaining components of the tap 1400 other than some structures different from those of the tap 1200 of FIG. 12B may be substantially identical in structure, material, formation method, and function to those of the tap 1200 shown in FIG. 12B, and as such redundant description thereof will herein be omitted for brevity. For convenience of description, the tap 1400 shown in FIG. 14B will hereinafter be described centering upon characteristics different from those of the tap 1200 shown in FIG. 12B.

The width WP of the first potential adjustment region PT1 may be larger than the width WD of the first detection node DN1.

As the width WP of the first potential adjustment region PT1 shown in FIG. 14B increases as compared to that of FIG. 13B, not only the depletion region formed at the boundary between the first potential adjustment region PT1 and the N$^+$ impurity region DN1-1, but also the potential barrier formed by a region (i.e., the first potential adjustment region PT1 of FIG. 14A does not overlap the first detection node DN1) extending in a manner that the first potential adjustment region PT1 has a larger width than the first detection node DN1 can be formed over a wider region. The first potential adjustment region PT1 may refer to a region in which majority carriers doped with P-type impurities are holes, and may act as a potential barrier that blocks the flow of photocharges.

Accordingly, the noise blocking capability of preventing photocharges from moving toward the N$^+$ impurity region DN1-1 and being captured in a period where the first detection node DN1 should not capture photocharges may be further improved. However, in a period where the first detection node DN1 needs to capture photocharges, the doping concentration of the first potential adjustment region PT1 can be experimentally determined so that the charge collection capability for enabling the potential barrier to quickly capture photocharges is not lowered more than necessary.

Although the embodiment of FIG. 14B has been described focusing upon the first potential adjustment region PT1, substantially the same description as given above can also be applied to the second to fourth potential adjustment regions PT2 to PT4.

Figure 15A:
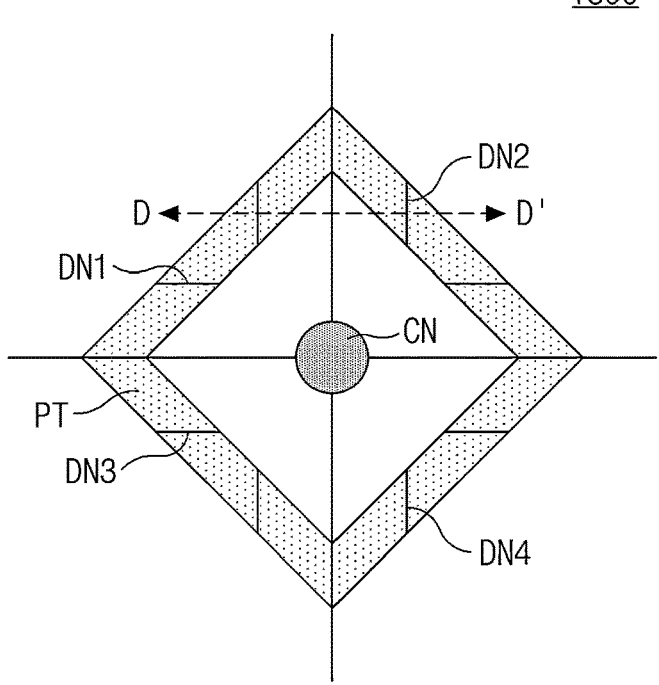
FIG. 15A is a diagram illustrating another example of a tap disposed in the pixel array shown in FIG. 2 based on some implementations of the disclosed technology.

FIG. 15A is a diagram illustrating another example of a tap 1500 disposed in the pixel array 30 shown in FIG. 2 based on some implementations of the disclosed technology.

Referring to FIG. 15A, a tap 1500 may correspond to any one of first taps (e.g., TA1201) and second taps (e.g., TB0112) included in the pixel array 30 shown in FIG. 2.

The tap 1500 may include a potential adjustment region PT together with the control node CN and the first to fourth detection nodes DN1 to DN4. The potential adjustment region PT may have a lozenge-ring shape that overlaps the first to fourth detection nodes DN1 to DN4 and contacts each of the first to fourth detection nodes DN1 to DN4 and each side of the first to fourth detection nodes DN1 to DN4 when viewed in a plane. In addition, the potential adjustment region PT may have a ring shape surrounding the control node CN.

In the embodiment of FIG. 15A, the potential adjustment region PT may have the same width as the height of a trapezoid of each of the first to fourth detection nodes DN1 to DN4, but the scope of the disclosed technology is not limited thereto. For example, the potential adjustment region PT may have a width greater than or less than the height of a trapezoid of each of the first to fourth detection nodes DN1 to DN4.

Figure 15B:
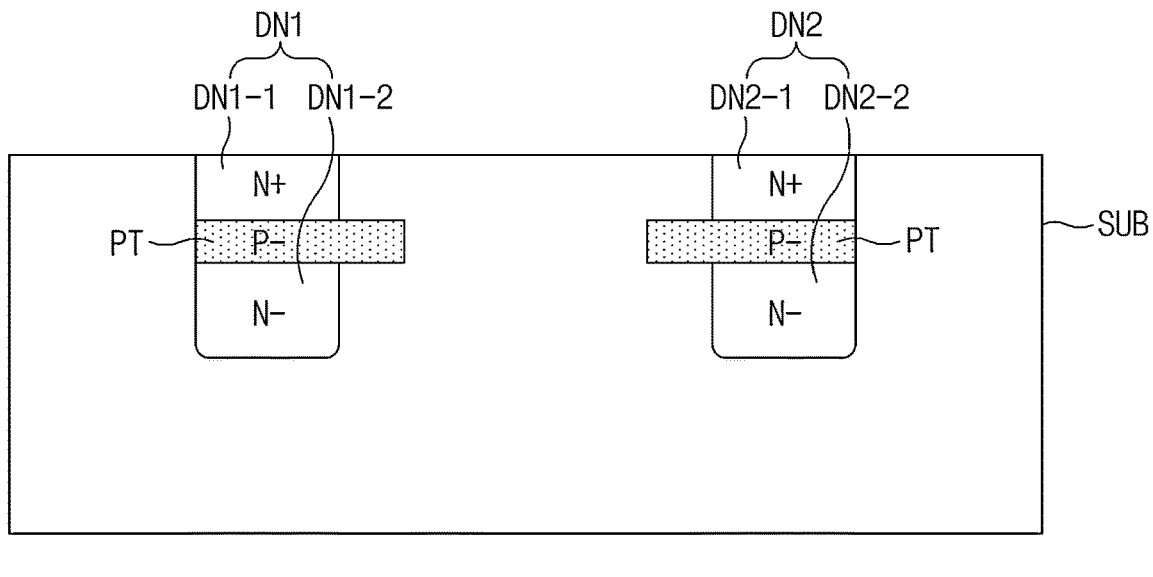
FIG. 15B is a view showing an example of a cross-sectional structure of a tap taken along a fourth cutting line shown in FIG. 15A based on some implementations of the disclosed technology.

FIG. 15B is a view showing an example of a cross-sectional structure of a tap 1500 taken along the fourth cutting line D-D' shown in FIG. 15A based on some implementations of the disclosed technology.

Referring to FIG. 15B, the tap 1500 may be implemented as a stacked structure that is in contact with a first surface of a substrate SUB within the substrate SUB.

The remaining components of the tap 1500 other than some structures different from those of the tap 1200 of FIG. 12B may be substantially identical in structure, material, formation method, and function to those of the tap 1200 shown in FIG. 12B, and as such redundant description thereof will herein be omitted for brevity. For convenience of description, the tap 1500 shown in FIG. 15B will hereinafter be described centering upon characteristics different from those of the tap 1200 shown in FIG. 12B.

The potential adjustment region PT may include a region overlapping the entire first detection node DN1, and a region disposed between the first detection node DN1 and the second detection node DN2 adjacent to each other without overlapping the first detection node DN1.

In FIG. 15B, as the potential adjustment region PT is disposed not only in the entire first detection node DN1 but also between the first detection node DN1 and the second detection node DN2 adjacent to each other, not only a depletion region formed at a boundary between the potential adjustment region PT and the N$^+$ impurity region DN1-1, but also the potential barrier formed by a region disposed between the first detection node DN1 and the second detection node DN2 can be formed over a wider region.

Accordingly, the noise blocking capability of preventing photocharges from moving toward the N$^+$ impurity region DN1-1 and being captured in a period where the first detection node DN1 should not capture photocharges may be further improved. In addition, due to the potential adjustment region PT disposed between the first detection node DN1 and the second detection node DN2, crosstalk, which indicates that photocharges generated by a pixel having the second detection node DN2 rather than the other pixel having the first detection node DN1 are captured by the first detection node DN1, can be suppressed. Alternatively, crosstalk, which indicates that photocharges generated by the pixel having the first detection node DN1 rather than the pixel having the second detection node DN2 are captured by the second detection node DN2, can be suppressed.

However, the doping concentration of the potential adjustment region PT can be experimentally determined such that the charge collection capability for enabling the potential barrier to quickly capture photocharges in a period where the first detection node DN1 should capture photocharges is not deteriorated.

Although the embodiment of FIG. 15B has been described focusing upon the potential adjustment region PT overlapping the first detection node DN1 for convenience of description, other implementations are also possible, and substantially the same description can also be applied to the potential adjustment region PT overlapping the second to fourth detection nodes DN2 to DN4.

Figure 16A:
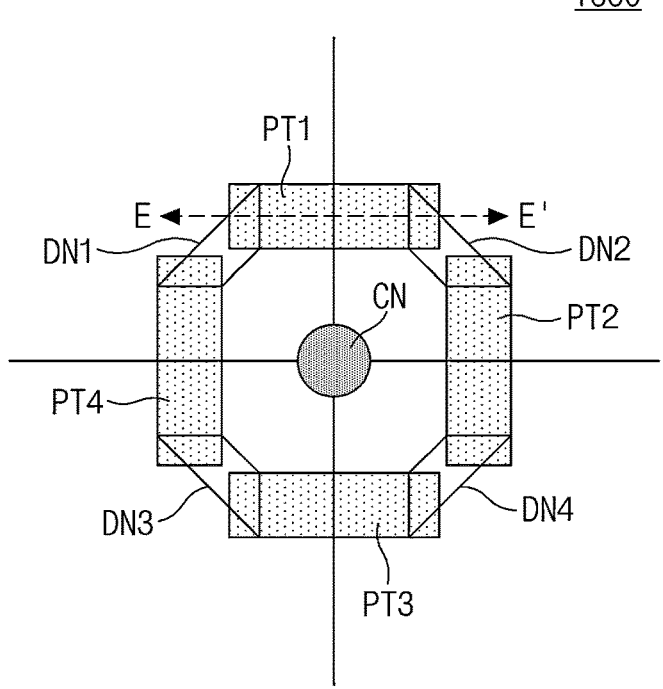
FIG. 16A is a diagram illustrating still another example of a tap disposed in the pixel array shown in FIG. 2 based on some implementations of the disclosed technology.

FIG. 16A is a diagram illustrating still another example of a tap 1600 disposed in the pixel array 30 shown in FIG. 2 based on some implementations of the disclosed technology.

Referring to FIG. 16A, a tap 1600 may correspond to any one of first taps (e.g., TA1201) and second taps (e.g., TB0112) included in the pixel array 30 shown in FIG. 2.

The tap 1600 may include first to fourth potential adjustment regions PT1 to PT4 together with the control node CN and the first to fourth detection nodes DN1 to DN4.

The first potential adjustment region PT1 may have a rectangular shape that overlaps a portion of the first and second detection nodes DN1 and DN2 and is disposed between the first detection node DN1 and the second detection node DN2.

The second potential adjustment region PT2 may have a rectangular shape that overlaps a portion of the second and fourth detection nodes DN2 and DN4 and is disposed between the second detection node DN2 and the fourth detection node DN4.

The third potential adjustment region PT3 may have a rectangular shape that overlaps a portion of the third and fourth detection nodes DN3 and DN4 and is disposed between the third detection node DN3 and the fourth detection node DN4.

The fourth potential adjustment region PT4 may have a rectangular shape that overlaps a portion of the first and third detection nodes DN1 and DN3 and is disposed between the first detection node DN1 and the third detection node DN3.

Each of the first to fourth detection nodes DN1 to DN4 may include a region that overlaps two of the first to fourth potential adjustment regions PT1 to PT4, and a region that does not overlap two of the first to fourth potential adjustment regions PT1 to PT4.

In the embodiment of FIG. 16A, each of the first to fourth potential adjustment regions PT1 to PT4 may have the same width as the hypotenuse of a trapezoid of each of the first to fourth detection nodes DN1 to DN4, without being limited thereto. For example, each of the first to fourth potential adjustment regions PT1 to PT4 may have a smaller or larger width than the hypotenuse of the trapezoid of each of the first to fourth detection nodes DN1 to DN4.

Figure 16B:
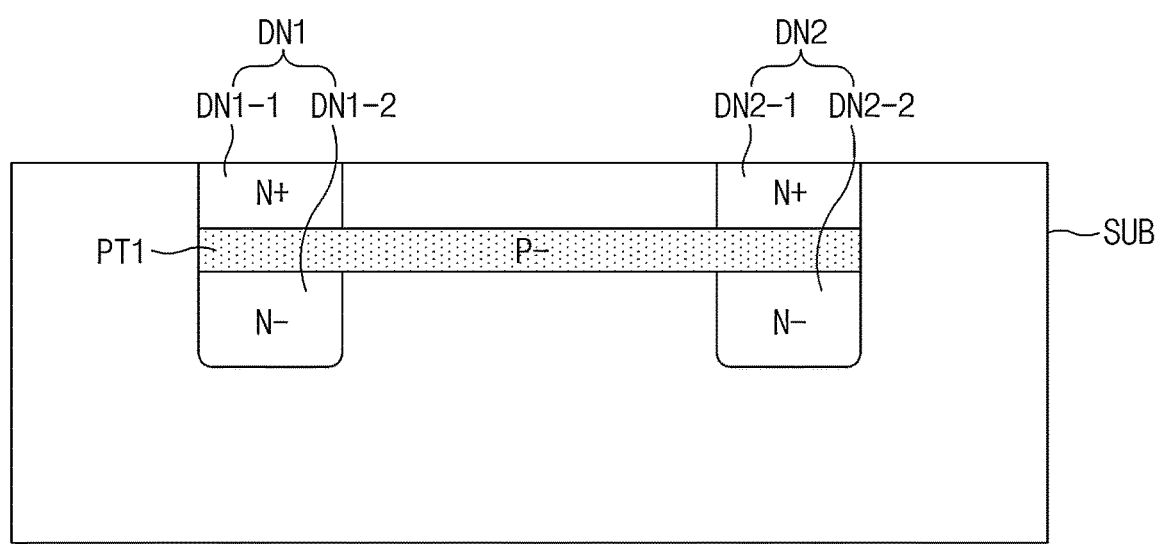
FIG. 16B is a cross-sectional view showing an example of a cross-sectional structure of a tap taken along a fifth cutting line shown in FIG. 16A based on some implementations of the disclosed technology.

FIG. 16B is a cross-sectional view showing an example of a cross-sectional structure of a tap 1600 taken along the fifth cutting line E-E' shown in FIG. 16A based on some implementations of the disclosed technology.

Referring to FIG. 16B, the tap 1600 may be implemented as a stacked structure that is in contact with a first surface of a substrate SUB within the substrate SUB.

The remaining components of the tap 1600 other than some structures different from those of the tap 1500 of FIG. 15B may be substantially identical in structure, material, formation method, and function to those of the tap 1500 shown in FIG. 15B, and as such redundant description thereof will herein be omitted for brevity. For convenience of description, the tap 1600 shown in FIG. 16B will hereinafter be described centering upon characteristics different from those of the tap 1500 shown in FIG. 15B.

The first potential adjustment region PT1 may include a region that overlaps a portion of each of the first detection node DN1 and the second detection node DN2, and a region that is disposed between the first detection node DN1 and the second detection node DN2 without overlapping the first detection node DN1 or the second detection node DN2.

As the first potential adjustment region PT1 is disposed not only in a portion of the first detection node DN1 but also between the first detection node DN1 and the second detection node DN2 adjacent to each other, not only a depletion region formed at a boundary between the first potential adjustment region PT1 and the N±impurity region DN1-1, but also the potential barrier formed by a region disposed between the first detection node DN1 and the second detection node DN2 can be formed over a wider region.

Accordingly, the noise blocking capability of preventing photocharges from moving toward the $N^+$ impurity region DN1-1 and being captured in a period where the first detection node DN1 should not capture photocharges may be further improved. In addition, due to the potential adjustment region PT disposed between the first detection node DN1 and the second detection node DN2, crosstalk, which indicates that photocharges generated by a pixel having the second detection node DN2 rather than a pixel having the first detection node DN1 are captured by the first detection node DN1, can be suppressed. Alternatively, crosstalk, which indicates that photocharges generated by the pixel having the first detection node DN1 rather than the pixel having the second detection node DN2 are captured by the second detection node DN2, can be suppressed.

However, the doping concentration of the potential adjustment region PT can be experimentally determined such that the charge collection capability for enabling the potential barrier to quickly capture photocharges in a period where the first detection node DN1 should capture photocharges is not deteriorated.

In addition, unlike FIGS. 15A and 15B, since the first detection node DN1 includes a region that does not overlap the first potential adjustment region PT1 or the fourth potential adjustment region PT4, the charge collection capability can be relatively improved. In this case, the region that does not overlap the first potential adjustment region PT1 or the fourth potential adjustment region PT4 may be located relatively far from an adjacent pixel so as not to increase crosstalk between pixels.

Although the embodiment of FIG. 16B has been described focusing upon the first potential adjustment region PT1 for convenience of description, other implementations are also possible, and substantially the same description can also be applied to the second to fourth potential adjustment regions PT2 to PT4.

Although FIGS. 12A to 16B have described various embodiments of the potential adjustment region that can act as a potential barrier for a corresponding detection node, the charge collection capability, the noise blocking capability, and the degree of crosstalk between pixels can be determined according to the doping concentration and thickness of the potential adjustment region, the location and width of a region overlapping the corresponding detection node, and the location and width of a peripheral region that does not overlap the corresponding detection node. The charge collection capability, the noise blocking capability, and the degree of crosstalk in the detection node required for the design specification may vary depending on various design specifications. The doping concentration and thickness of the potential adjustment region, the location and width of the region overlapping the corresponding detection node, and the location and width of the peripheral region not overlapping the corresponding detection node can be experimentally determined so that the charge collection capability, the noise blocking capability, and the degree of crosstalk in the required detection node can be satisfied.

As is apparent from the above description, the image sensing device based on some implementations of the disclosed technology may add an oppositely doped region to a detection node side for photocharge detection, and may thus reduce generation of noise caused by unintended photocharge collection.

The embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:

1. An image sensing device comprising:
a first detection structure and a second detection structure, each of the first detection structure and the second detection structure configured to generate a current in a substrate and to capture photocharges generated by incident light and carried by the current,
wherein each of the first detection structure and the second detection structure includes:
at least one detection node configured to capture the photocharges, the at least one detection node including first conductive impurities; and
a potential adjustment region overlapping at least a portion of each of the at least one detection node, the potential adjustment region including second conductive impurities different from the first conductive impurities.

2. The image sensing device according to claim 1, wherein:
each of the at least one detection node includes a first doped region and a second doped region that are doped with the first conductive impurities having different doping concentrations from each other,
wherein the first doped region has a higher doping concentration than the second doped region.

3. The image sensing device according to claim 2, wherein:
the potential adjustment region is disposed between the first doped region and the second doped region.

4. The image sensing device according to claim 2, wherein:
the potential adjustment region has a lower doping concentration than the first doped region.

5. The image sensing device according to claim 1, wherein:
the potential adjustment region is formed in a shape corresponding to each of the at least one detection node when viewed in a plane.

6. The image sensing device according to claim 5, wherein:
the potential adjustment region has a smaller area than that of each of the at least one detection node.

7. The image sensing device according to claim 5, wherein:

the potential adjustment region has a same area as that of each of the at least one detection node.

8. The image sensing device according to claim 5, wherein:

the potential adjustment region has a larger area than that of each of the at least one detection node.

9. The image sensing device according to claim 1, wherein each of the first detection structure and the second detection structure includes:

a control node configured to receive a control signal and generate the current in the substrate; and wherein the at least one detection node includes detection nodes respectively included in four different adjacent pixels, wherein the potential adjustment region is formed in a ring shape that overlaps the detection nodes to surround the control node.

10. The image sensing device according to claim 1, wherein:

the at least one detection node includes detection nodes respectively included in four different adjacent pixels, the potential adjustment region overlaps portions of each of adjacent detection nodes among the detection nodes, and is disposed between the adjacent detection nodes.

11. The image sensing device according to claim 1, wherein:

the first detection structure and the second detection structure are respectively disposed in vertex regions that face each other in a diagonal direction within one pixel.

12. The image sensing device according to claim 1, further comprising:

a pixel array configured to include a plurality of pixels arranged in a matrix shape and configured to respond to the incident light to produce the photocharges, wherein the first detection structure and the second detection structure are alternately arranged in a diagonal direction within the pixel array.

13. The image sensing device according to claim 12, wherein:

a vertex region in which the first detection structure is disposed and a vertex region in which the first detection structure or the second detection structure is not disposed are alternately disposed in a row direction of the pixel array; or a vertex region in which the second detection structure is disposed and a vertex region in which the first detection structure or the second detection structure is not disposed are alternately disposed in the row direction of the pixel array.

14. The image sensing device according to claim 12, wherein:

a vertex region in which the first detection structure is disposed and a vertex region in which the first detection structure or the second detection structure is not disposed are alternately disposed in a column direction of the pixel array; or a vertex region in which the second detection structure is disposed and a vertex region in which the first detection structure or the second detection structure is not disposed are alternately disposed in the column direction of the pixel array.

15. An image sensing device comprising:

a first detection structure and a second detection structure, each of which is configured to generate a current in a substrate and to capture photocharges generated by incident light and carried by the current, wherein each of the first detection structure and the second detection structure includes:

a first doped region that captures the photocharges and includes first conductive impurities; and a potential adjustment region that is in contact with at least a portion of the first doped region and includes second conductive impurities having a conductivity type different from that of the first conductive impurities.

16. The image sensing device of claim 15, wherein each of the first detection structure and the second detection structure further includes:

a second doped region including impurities having a conductivity type same as that of the first doped region and configured to form a potential gradient with the first doped region.

17. The image sensing device of claim 16, wherein the potential adjustment region is disposed between the first doped region and the second doped region.

18. The image sensing device of claim 15, wherein the first detection structure and the second detection structure include a first control node and a second control node, respectively, and the first control node and the second control node are configured to receive different control signals from each other.

19. The image sensing device of claim 18, wherein the current has an intensity that depends on differences of the different control signals and a distance between the first control node and the second control node.

20. The image sensing device of claim 18, wherein the first detection structure is disposed to overlap portions of multiple pixels such that the multiple pixels share the first control node.

* * * * *